United States Patent
Tarsa et al.

(10) Patent No.: US 10,359,151 B2
(45) Date of Patent: Jul. 23, 2019

(54) SOLID STATE LAMP WITH THERMAL SPREADING ELEMENTS AND LIGHT DIRECTING OPTICS

(75) Inventors: Eric Tarsa, Goleta, CA (US); Ronan Letoquin, Fremont, CA (US); Tao Tong, Oxnard, CA (US); Bernd Keller, Santa Barbara, CA (US)

(73) Assignee: IDEAL INDUSTRIES LIGHTING LLC, Sycamore, IL (US)

( * ) Notice: Subject to any disclaimer, the term of this patent is extended or adjusted under 35 U.S.C. 154(b) by 363 days.

(21) Appl. No.: 13/029,068

(22) Filed: Feb. 16, 2011

(65) Prior Publication Data

US 2011/0215345 A1 Sep. 8, 2011

Related U.S. Application Data

(63) Continuation-in-part of application No. 12/848,825, filed on Aug. 2, 2010, now Pat. No. 8,562,161, and a continuation-in-part of application No. 12/889,719, filed on Sep. 24, 2010, and a continuation-in-part of application No. 12/975,820, filed on Dec. 22, 2010.
(Continued)

(51) Int. Cl.
*F21K 9/232* (2016.01)
*F21V 3/02* (2006.01)
(Continued)

(52) U.S. Cl.
CPC ............... *F21K 9/232* (2016.08); *F21K 9/60* (2016.08); *F21K 9/62* (2016.08); *F21K 9/64* (2016.08);
(Continued)

(58) Field of Classification Search
CPC .. F21V 17/04–06; F21V 17/101; F21K 9/232; F21K 9/61; F21K 9/62; F21K 9/64; F21K 9/69
(Continued)

(56) References Cited

U.S. PATENT DOCUMENTS 2,394,992 A 2/1946 Franck ..................... 362/311.12
3,143,592 A 8/1964 William ...................... 174/16.3
(Continued)

FOREIGN PATENT DOCUMENTS

CN 1425117 6/2003
CN 1465106 A 12/2003
(Continued)

OTHER PUBLICATIONS

U.S. Appl. No. 11/656,759, filed Jan. 22, 2007 Chitnis.
(Continued)

*Primary Examiner* — Sean P Gramling
(74) *Attorney, Agent, or Firm* — Ferguson Case Orr Paterson

(57) ABSTRACT

Lamps and bulbs are disclosed generally comprising different combinations and arrangements of a light source, one or more wavelength conversion materials, regions or layers which are positioned separately or remotely with respect to the light source, and a separate diffusing layer. This arrangement allows for the fabrication of lamps and bulbs that are efficient, reliable and cost effective and can provide an essentially omni-directional emission pattern, even with a light source comprised of a co-planar arrangement of LEDs. The lamps according to the present invention can also comprise thermal management features that provide for efficient dissipation of heat from the LEDs, which in turn allows the LEDs to operate at lower temperatures. The lamps can also comprise optical elements to help change the emission pattern from the generally directional (e.g. Lambertian) pattern of the LEDs to a more omni-directional pattern.

10 Claims, 8 Drawing Sheets

Related U.S. Application Data

(60) Provisional application No. 61/339,516, filed on Mar. 3, 2010, provisional application No. 61/339,515, filed on Mar. 3, 2010, provisional application No. 61/386,437, filed on Sep. 24, 2010, provisional application No. 61/424,665, filed on Dec. 19, 2010, provisional application No. 61/424,670, filed on Dec. 19, 2010, provisional application No. 61/434,355, filed on Jan. 19, 2011, provisional application No. 61/435,326, filed on Jan. 23, 2011, provisional application No. 61/435,759, filed on Jan. 24, 2011.

(51) Int. Cl.
*F21V 29/00* (2015.01)
*F21K 9/60* (2016.01)
*F21K 9/62* (2016.01)
*F21K 9/64* (2016.01)
*F21V 3/12* (2018.01)
*F21V 29/505* (2015.01)
*F21V 29/77* (2015.01)
*F21Y 115/10* (2016.01)

(52) U.S. Cl.
CPC .............. *F21V 3/02* (2013.01); *F21V 3/12* (2018.02); *F21V 29/00* (2013.01); *F21V 29/505* (2015.01); *F21V 29/773* (2015.01); *F21Y 2115/10* (2016.08); *H01L 2224/48091* (2013.01)

(58) Field of Classification Search
USPC .... 362/235, 249.02, 311.01–311.02, 84, 650
See application file for complete search history.

(56) References Cited

U.S. PATENT DOCUMENTS

| | | | |
|---|---|---|---|
| 3,581,162 A | 5/1971 | Wheatley | |
| 4,204,246 A | 5/1980 | Arii et al. | 361/699 |
| 4,219,871 A | 8/1980 | Larrimore | 362/264 |
| 5,463,280 A | 10/1995 | Johnson | |
| 5,535,230 A | 7/1996 | Abe | |
| 5,561,346 A | 10/1996 | Byrne | |
| 5,581,683 A | 12/1996 | Bertignoll et al. | |
| 5,585,783 A | 12/1996 | Hall | |
| 5,655,830 A | 8/1997 | Ruskouski | |
| 5,688,042 A | 11/1997 | Madadi et al. | |
| 5,806,965 A | 9/1998 | Deese | |
| 5,838,101 A | 11/1998 | Pappalardo | 313/487 |
| 5,890,794 A | 4/1999 | Abtahi et al. | |
| 5,934,798 A | 8/1999 | Roller et al. | 362/497 |
| 5,947,588 A | 9/1999 | Huang | |
| 5,949,347 A | 9/1999 | Wu | |
| 6,218,785 B1 | 4/2001 | Incerti | 315/185 S |
| 6,220,722 B1 | 4/2001 | Begemann | |
| 6,220,731 B1 | 4/2001 | Ryan | 362/373 |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,270,722 B1 | 8/2001 | Yang et al. | 422/37 |
| 6,276,822 B1 | 8/2001 | Bedrosian et al. | |
| 6,350,041 B1 | 2/2002 | Tarsa | |
| 6,404,131 B1 | 6/2002 | Kawano et al. | 315/82 |
| 6,465,961 B1 | 10/2002 | Cao | 315/58 |
| 6,517,221 B1 | 2/2003 | Xie | 362/373 |
| 6,523,978 B1 | 2/2003 | Huang | |
| 6,550,953 B1 | 4/2003 | Ichikawa et al. | |
| 6,634,770 B2 | 10/2003 | Densen | |
| 6,659,632 B2 | 12/2003 | Chen | |
| 6,709,132 B2 | 3/2004 | Ishibashi | |
| 6,746,885 B2 | 6/2004 | Cao | 438/26 |
| 6,758,582 B1 | 7/2004 | Hsiao | 362/302 |
| 6,764,202 B1 | 7/2004 | Herring et al. | 362/371 |
| 6,803,607 B1 | 10/2004 | Chan et al. | |
| 6,848,819 B1 | 2/2005 | Arndt et al. | |
| 6,860,620 B2 | 3/2005 | Kuan et al. | 362/294 |
| 6,864,513 B2 | 3/2005 | Lin et al. | |
| 6,910,794 B2 | 6/2005 | Rice | 362/547 |
| 6,948,829 B2 | 9/2005 | Verdes et al. | |
| 6,982,518 B2 | 1/2006 | Chou et al. | |
| 6,997,580 B2 | 2/2006 | Wong | 362/311.02 |
| 7,048,412 B2 | 5/2006 | Martin et al. | |
| 7,080,924 B2 | 6/2006 | Tseng et al. | |
| 7,086,756 B2 | 8/2006 | Maxik | |
| 7,086,767 B2 | 8/2006 | Sidwell et al. | |
| 7,094,362 B2 | 8/2006 | Setlur et al. | 252/301 |
| 7,140,753 B2 | 11/2006 | Wang et al. | 362/294 |
| 7,144,135 B2 | 12/2006 | Martin et al. | |
| 7,160,012 B2 | 1/2007 | Hilscher et al. | |
| 7,160,120 B2 | 1/2007 | Zhang et al. | |
| 7,165,866 B2 | 1/2007 | Li | |
| 7,172,314 B2 | 2/2007 | Currie et al. | |
| 7,213,940 B1 | 5/2007 | Van de Ven | |
| D546,980 S | 7/2007 | Lo | |
| 7,250,715 B2 | 7/2007 | Mueller | 313/485 |
| 7,270,446 B2 | 9/2007 | Chang et al. | 362/294 |
| D553,267 S | 10/2007 | Yuen | |
| 7,350,936 B2 | 4/2008 | Ducharme et al. | 362/231 |
| 7,354,174 B1 | 4/2008 | Yan | |
| 7,377,674 B2 | 5/2008 | Klinkman et al. | 362/484 |
| 7,396,142 B2 | 7/2008 | Laizure, Jr. et al. | |
| 7,405,857 B2 | 7/2008 | Ma et al. | |
| 7,413,325 B2 | 8/2008 | Chen | 362/249.01 |
| D581,556 S | 11/2008 | To et al. | D26/2 |
| 7,547,124 B2 | 6/2009 | Chang et al. | 362/373 |
| 7,549,782 B2 | 6/2009 | Ng et al. | 362/555 |
| 7,553,047 B2 | 6/2009 | Shin et al. | 362/294 |
| 7,600,882 B1 | 10/2009 | Morejon et al. | |
| 7,607,802 B2 | 10/2009 | Kang et al. | 362/294 |
| 7,614,759 B2 | 11/2009 | Negley | |
| 7,618,157 B1 | 11/2009 | Galvez | |
| 7,663,152 B2 | 2/2010 | Bierhuizen | |
| 7,663,315 B1 | 2/2010 | Hulse | |
| 7,686,478 B1 | 3/2010 | Hulse | |
| 7,740,365 B2 | 3/2010 | Huttner et al. | 362/97 |
| 7,710,016 B2 | 5/2010 | Miki et al. | 257/98 |
| 7,726,836 B2 | 6/2010 | Chen | |
| 7,753,568 B2 | 7/2010 | Hu et al. | 362/373 |
| 7,810,954 B2 | 10/2010 | Kolodin | 362/277 |
| 7,824,065 B2 | 11/2010 | Maxik | |
| D629,928 S | 12/2010 | Chen et al. | |
| 7,884,538 B2 | 2/2011 | Mitsuishi et al. | 313/502 |
| 7,909,481 B1 | 3/2011 | Zhang | 362/249.02 |
| 7,976,335 B2 | 7/2011 | Weber et al. | 439/487 |
| 7,989,236 B2 | 8/2011 | Yamaguchi et al. | 438/26 |
| 8,021,025 B2 | 9/2011 | Lee | |
| 8,235,571 B2 | 8/2012 | Park | 362/555 |
| 8,253,316 B2 | 8/2012 | Sun et al. | |
| 8,272,762 B2 | 9/2012 | Maxik et al. | |
| 8,274,241 B2 | 9/2012 | Guest et al. | |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,309,969 B2 | 11/2012 | Suehiro et al. | 257/79 |
| 8,314,537 B2 | 11/2012 | Gielen et al. | 313/46 |
| 8,322,896 B2 | 12/2012 | Falicoff et al. | |
| 8,348,470 B2 | 1/2013 | Liu et al. | 362/294 |
| 8,371,722 B2 | 2/2013 | Carroll | |
| 8,400,051 B2 | 3/2013 | Hakata et al. | |
| 8,410,512 B2 | 4/2013 | Andrews | 257/99 |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,449,154 B2 | 5/2013 | Uemoto et al. | |
| 8,502,468 B2 | 8/2013 | Li et al. | |
| 8,568,009 B2 | 10/2013 | Chiang et al. | 362/563 |
| 8,760,042 B2 | 1/2014 | Sakai et al. | |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |

(56) References Cited

U.S. PATENT DOCUMENTS

| | | |
|---|---|---|
| 8,752,984 B2 | 6/2014 | Lenk et al. |
| 8,922,106 B2 | 12/2014 | Helbing et al. .......... 313/318.11 |
| 9,316,386 B2 | 4/2016 | Breidenassel |
| 2002/0047516 A1 | 4/2002 | Iwasa et al. ................... 313/512 |
| 2002/0114169 A1 | 8/2002 | Harada et al. ................ 362/558 |
| 2003/0021113 A1 | 1/2003 | Begemann |
| 2003/0038291 A1 | 2/2003 | Cao |
| 2003/0081419 A1 | 5/2003 | Jacob et al. ................... 362/364 |
| 2003/0185005 A1 | 10/2003 | Sommers et al. |
| 2004/0021629 A1 | 2/2004 | Sasuga et al. |
| 2004/0159846 A1 | 8/2004 | Doxsee |
| 2004/0201990 A1 | 10/2004 | Meyer |
| 2004/0223315 A1 | 11/2004 | Suehiro et al. ................. 362/84 |
| 2005/0068776 A1 | 3/2005 | Ge ............................ 362/296.08 |
| 2005/0168990 A1 | 8/2005 | Nagata et al. ................ 362/294 |
| 2005/0174780 A1 | 8/2005 | Park ............................ 362/294 |
| 2005/0184638 A1 | 8/2005 | Mueller et al. ............... 313/485 |
| 2005/0219060 A1 | 10/2005 | Curran et al. ............. 340/815.45 |
| 2005/0225988 A1 | 10/2005 | Chaves et al. |
| 2005/0253153 A1 | 11/2005 | Harada |
| 2005/0276053 A1 | 12/2005 | Nortrup et al. ............... 362/294 |
| 2006/0097245 A1 | 5/2006 | Aanegola et al. .............. 257/26 |
| 2006/0097385 A1 | 5/2006 | Negley ........................... 257/722 |
| 2006/0115482 A1 | 5/2006 | Alferink et al. ................ 438/22 |
| 2006/0138435 A1 | 6/2006 | Tarsa et al. .................... 257/89 |
| 2006/0152140 A1 | 7/2006 | Brandes ......................... 313/503 |
| 2006/0152820 A1 | 7/2006 | Lien et al. ..................... 359/726 |
| 2006/0180774 A1 | 8/2006 | Endo ........................... 250/485.1 |
| 2006/0227558 A1 | 10/2006 | Osawa et al. |
| 2006/0250792 A1 | 11/2006 | Izardel .......................... 362/231 |
| 2006/0268555 A1 | 11/2006 | Kelly |
| 2006/0291249 A1* | 12/2006 | Tessnow .............. G02B 6/0001 362/615 |
| 2007/0047232 A1 | 3/2007 | Kim et al. |
| 2007/0070645 A1* | 3/2007 | Coushaine ........... B60Q 1/2696 362/555 |
| 2007/0090737 A1 | 4/2007 | Hu et al. ......................... 313/11 |
| 2007/0091633 A1 | 4/2007 | Harrity et al. |
| 2007/0139938 A1 | 6/2007 | Petroski et al. |
| 2007/0139949 A1* | 6/2007 | Tanda et al. .................. 362/551 |
| 2007/0158668 A1 | 7/2007 | Tarsa et al. ..................... 257/98 |
| 2007/0165408 A1 | 7/2007 | Li |
| 2007/0182299 A1 | 8/2007 | Ouderkirk et al. ........... 313/110 |
| 2007/0206375 A1 | 9/2007 | Lys |
| 2007/0215890 A1 | 9/2007 | Harbers et al. |
| 2007/0223219 A1 | 9/2007 | Medendorp |
| 2007/0263405 A1 | 11/2007 | Ng et al. ........................ 362/555 |
| 2007/0267976 A1 | 11/2007 | Bohler |
| 2007/0274080 A1 | 11/2007 | Negley et al. ................. 362/341 |
| 2007/0285924 A1 | 12/2007 | Morris et al. ................. 362/264 |
| 2007/0297183 A1 | 12/2007 | Coushaine |
| 2008/0037257 A1 | 2/2008 | Bolta |
| 2008/0055908 A1 | 3/2008 | Wu et al. ....................... 362/294 |
| 2008/0062694 A1 | 3/2008 | Lai et al. ........................ 362/294 |
| 2008/0067640 A1 | 3/2008 | Do et al. |
| 2008/0080165 A1 | 4/2008 | Kim et al. |
| 2008/0084701 A1 | 4/2008 | Van de Ven |
| 2008/0093615 A1 | 4/2008 | Lin |
| 2008/0106893 A1 | 5/2008 | Johnson et al. |
| 2008/0117620 A1 | 5/2008 | Hama et al. ..................... 362/84 |
| 2008/0128735 A1 | 6/2008 | Yoo et al. |
| 2008/0149166 A1 | 6/2008 | Beeson et al. ................ 136/248 |
| 2008/0173884 A1 | 7/2008 | Chitnis et al. .................. 257/98 |
| 2008/0179611 A1 | 7/2008 | Chitnis et al. .................. 257/98 |
| 2008/0192458 A1 | 8/2008 | Li |
| 2008/0232119 A1 | 9/2008 | Ribarich ........................ 362/373 |
| 2008/0285279 A1 | 11/2008 | Ng et al. ........................ 362/249 |
| 2008/0308825 A1 | 12/2008 | Chakraborty et al. .......... 257/98 |
| 2009/0001399 A1 | 1/2009 | Diana et al. .................... 257/98 |
| 2009/0015137 A1 | 1/2009 | Su et al. ........................ 313/503 |
| 2009/0040760 A1 | 2/2009 | Chen et al. .................... 362/249 |
| 2009/0046473 A1 | 2/2009 | Tsai et al. ...................... 362/373 |
| 2009/0058256 A1 | 3/2009 | Mitsuishi et al. ............. 313/487 |
| 2009/0059559 A1 | 3/2009 | Pabst |
| 2009/0067180 A1 | 3/2009 | Tahmosybayat ............... 362/339 |
| 2009/0086492 A1 | 4/2009 | Meyer |
| 2009/0086508 A1 | 4/2009 | Bierhuizen ..................... 362/617 |
| 2009/0095960 A1 | 4/2009 | Murayama ....................... 257/79 |
| 2009/0100213 A1 | 4/2009 | Dyke et al. |
| 2009/0101930 A1 | 4/2009 | Li |
| 2009/0103293 A1* | 4/2009 | Harbers .................... F21K 9/54 362/231 |
| 2009/0103296 A1 | 4/2009 | Harbers et al. |
| 2009/0113296 A1 | 4/2009 | Harbers et al. |
| 2009/0116217 A1 | 5/2009 | Teng et al. |
| 2009/0140633 A1 | 6/2009 | Tanimoto et al. ............. 313/503 |
| 2009/0141474 A1 | 6/2009 | Kolodin |
| 2009/0147179 A1 | 6/2009 | Yamashita |
| 2009/0175041 A1 | 7/2009 | Yuen et al. |
| 2009/0184618 A1 | 7/2009 | Hakata et al. |
| 2009/0190353 A1 | 7/2009 | Barker ........................... 362/249 |
| 2009/0195186 A1 | 8/2009 | Guest et al. ................... 315/294 |
| 2009/0201679 A1 | 8/2009 | Konaka .......................... 362/235 |
| 2009/0208307 A1 | 8/2009 | Haase ............................ 362/234 |
| 2009/0217970 A1 | 9/2009 | Zimmerman et al. ........ 136/252 |
| 2009/0262516 A1 | 10/2009 | Li .................................... 362/84 |
| 2009/0273727 A1 | 11/2009 | Kubota et al. .................. 349/62 |
| 2009/0273924 A1 | 11/2009 | Chiang .......................... 362/241 |
| 2009/0283779 A1 | 11/2009 | Negley et al. ................... 257/88 |
| 2009/0286337 A1 | 11/2009 | Lee, II .............................. 438/27 |
| 2009/0296387 A1 | 12/2009 | Reisenauer |
| 2009/0310368 A1 | 12/2009 | Incerti ........................... 362/326 |
| 2009/0316073 A1 | 12/2009 | Chen et al. ..................... 349/64 |
| 2009/0316383 A1 | 12/2009 | Son |
| 2009/0322197 A1 | 12/2009 | Helbing .......................... 445/48 |
| 2009/0322208 A1 | 12/2009 | Shaikevitch et al. ......... 313/503 |
| 2009/0322800 A1 | 12/2009 | Atkins ........................... 345/690 |
| 2009/0323333 A1 | 12/2009 | Chang |
| 2010/0020547 A1 | 1/2010 | Olsson .......................... 362/311 |
| 2010/0025700 A1 | 2/2010 | Jung et al. |
| 2010/0026185 A1 | 2/2010 | Betsuda |
| 2010/0027258 A1 | 2/2010 | Maxik et al. .................. 362/240 |
| 2010/0038660 A1 | 2/2010 | Shuja ............................... 257/98 |
| 2010/0046231 A1 | 2/2010 | Medinis ......................... 362/294 |
| 2010/0060130 A1 | 3/2010 | Li |
| 2010/0060144 A1 | 3/2010 | Justel et al. ................... 313/503 |
| 2010/0079061 A1 | 4/2010 | Tsai .............................. 313/504 |
| 2010/0091487 A1 | 4/2010 | Shin .............................. 362/235 |
| 2010/0096967 A1 | 4/2010 | Marinus et al. ................. 313/46 |
| 2010/0102707 A1 | 4/2010 | Fukuda et al. ................ 313/503 |
| 2010/0134047 A1 | 6/2010 | Hasnain |
| 2010/0140655 A1 | 6/2010 | Shi ................................... 257/99 |
| 2010/0149783 A1 | 6/2010 | Takenaka et al. ............... 362/84 |
| 2010/0149814 A1 | 6/2010 | Zhai et al. ....................... 257/88 |
| 2010/0170075 A1 | 7/2010 | Kanade et al. .................. 29/428 |
| 2010/0177522 A1 | 7/2010 | Lee ............................... 362/373 |
| 2010/0201284 A1 | 8/2010 | Kraus |
| 2010/0207502 A1 | 8/2010 | Cao et al. ........................ 313/46 |
| 2010/0219735 A1 | 9/2010 | Sakai et al. ..................... 313/46 |
| 2010/0232134 A1 | 9/2010 | Tran ................................ 362/84 |
| 2010/0244729 A1 | 9/2010 | Chen et al. .................... 315/291 |
| 2010/0246165 A1 | 9/2010 | Diaz et al. ..................... 362/183 |
| 2010/0014839 A1 | 10/2010 | Benoy et al. .................. 386/117 |
| 2010/0259918 A1 | 10/2010 | Rains, Jr. et al. ............... 362/84 |
| 2010/0264799 A1 | 10/2010 | Liu et al. ........................ 313/46 |
| 2010/0264826 A1 | 10/2010 | Yatsuda ......................... 315/112 |
| 2010/0314985 A1 | 12/2010 | Premysler ....................... 313/46 |
| 2010/0314996 A1 | 12/2010 | Van de Ven |
| 2010/0327745 A1 | 12/2010 | Dassanayake |
| 2010/0327755 A1 | 12/2010 | Dassanayake ................. 315/35 |
| 2010/0328925 A1 | 12/2010 | Hoelen ............................ 362/84 |
| 2011/0037368 A1 | 2/2011 | Huang ............................. 313/46 |
| 2011/0044022 A1 | 2/2011 | Ko et al. ......................... 362/84 |
| 2011/0058379 A1 | 3/2011 | Diamantidis ............. 362/296.01 |
| 2011/0068356 A1 | 3/2011 | Chaing et al. .................. 257/98 |
| 2011/0074271 A1 | 3/2011 | Takeshi et al. ................. 313/46 |
| 2011/0074296 A1 | 3/2011 | Shen et al. |
| 2011/0080096 A1 | 4/2011 | Dudik et al. .................. 315/112 |
| 2011/0080740 A1 | 4/2011 | Allen et al. .................... 362/294 |
| 2011/0080742 A1 | 4/2011 | Allen |
| 2011/0089804 A1 | 4/2011 | Mahalingam et al. .......... 313/46 |
| 2011/0089830 A1 | 4/2011 | Pickard et al. ................ 315/32 |
| 2011/0095686 A1 | 4/2011 | Falicoff |
| 2011/0133222 A1 | 6/2011 | Allen et al. ..................... 257/88 |

(56) References Cited

U.S. PATENT DOCUMENTS

| | | | |
|---|---|---|---|
| 2011/0149563 A1 | 6/2011 | Hsia | 362/221 |
| 2011/0149578 A1 | 6/2011 | Niiyama et al. | 362/294 |
| 2011/0157989 A1 | 6/2011 | Kanai | |
| 2011/0175528 A1 | 7/2011 | Rains et al. | 315/51 |
| 2011/0176291 A1 | 7/2011 | Sanders | |
| 2011/0176316 A1 | 7/2011 | Phipps et al. | |
| 2011/0205733 A1 | 8/2011 | Lenderink et al. | 362/231 |
| 2011/0215696 A1 | 9/2011 | Tong | |
| 2011/0215697 A1 | 9/2011 | Tong | |
| 2011/0216523 A1 | 9/2011 | Tong et al. | 362/84 |
| 2011/0242816 A1 | 10/2011 | Chowdhury et al. | 362/294 |
| 2011/0267835 A1* | 11/2011 | Boonekamp et al. | 362/555 |
| 2011/0273072 A1 | 11/2011 | Oki | 313/46 |
| 2011/0278609 A1 | 11/2011 | Jeong | 257/98 |
| 2011/0291560 A1 | 12/2011 | Wang et al. | 315/32 |
| 2011/0298371 A1 | 12/2011 | Brandes et al. | 315/32 |
| 2012/0040585 A1 | 2/2012 | Huang | |
| 2012/0155059 A1 | 6/2012 | Hoelen et al. | 362/84 |
| 2012/0161626 A1 | 6/2012 | Van De Ven et al. | 315/35 |
| 2012/0241778 A1 | 9/2012 | Franck | 257/88 |
| 2012/0320591 A1 | 12/2012 | Liao et al. | 362/249 |
| 2013/0049018 A1 | 2/2013 | Ramer et al. | 257/14 |
| 2013/0063945 A1 | 3/2013 | Wu et al. | 362/249 |
| 2013/0119280 A1 | 5/2013 | Fuchi et al. | 250/504 R |
| 2013/0249374 A1 | 9/2013 | Lee et al. | 313/12 |
| 2013/0293098 A1 | 11/2013 | Li et al. | 313/512 |

FOREIGN PATENT DOCUMENTS

| | | |
|---|---|---|
| CN | 1608326 | 4/2005 |
| CN | 1726410 | 1/2006 |
| CN | 1802533 | 7/2006 |
| CN | 1922286 A | 2/2007 |
| CN | 101012916 A | 8/2007 |
| CN | 101128695 | 2/2008 |
| CN | 10126232 A | 9/2008 |
| CN | 101262032 | 9/2008 |
| CN | 101262032 A | 9/2008 |
| CN | 1013388887 A | 1/2009 |
| CN | 101368719 A | 2/2009 |
| CN | 101440938 A | 5/2009 |
| CN | 101501388 A | 8/2009 |
| CN | 101641623 | 2/2010 |
| CN | 102077011 | 5/2011 |
| CN | 102859258 A | 1/2013 |
| DE | 10251955 | 5/2004 |
| DE | 10251955 A1 | 5/2004 |
| DE | 102004051382 | 4/2006 |
| DE | 102006061164 | 6/2008 |
| DE | 10 2007 037862 A1 | 10/2008 |
| DE | 202008013667 | 12/2008 |
| DE | 102011004718 | 8/2012 |
| EP | 0876085 | 11/1998 |
| EP | 0876085 A2 | 11/1998 |
| EP | 0890059 A1 | 1/1999 |
| EP | 1058221 A2 | 12/2000 |
| EP | 1881259 | 1/2008 |
| EP | 2146135 A2 | 1/2010 |
| EP | 2154420 | 2/2010 |
| EP | 2469154 | 6/2012 |
| FR | 2941346 | 7/2010 |
| GB | 2345954 A | 7/2000 |
| GB | 2 366 610 A | 3/2002 |
| GB | 2366610 | 3/2002 |
| GB | 2366610 A | 3/2002 |
| JP | H03081903 | 4/1991 |
| JP | H06283006 | 10/1994 |
| JP | H09265807 | 10/1997 |
| JP | H11-177149 | 2/1999 |
| JP | H1177149 | 7/1999 |
| JP | H11177149 | 7/1999 |
| JP | 11-213730 A | 8/1999 |
| JP | H11260125 | 9/1999 |
| JP | 2000022222 | 1/2000 |
| JP | 2000173304 | 6/2000 |
| JP | 2001118403 | 4/2001 |
| JP | 2002525814 | 8/2002 |
| JP | 2003515899 | 5/2003 |
| JP | 2004146225 | 5/2004 |
| JP | 2004241318 | 8/2004 |
| JP | 2005-093097 A | 4/2005 |
| JP | 2005108700 | 4/2005 |
| JP | 20051008700 | 4/2005 |
| JP | 2005244226 | 9/2005 |
| JP | 2005-277127 | 10/2005 |
| JP | 2005-286267 A | 10/2005 |
| JP | 2005277127 | 10/2005 |
| JP | 2005021635 | 11/2005 |
| JP | 2006019676 | 1/2006 |
| JP | 2006108661 | 4/2006 |
| JP | 2006148147 | 6/2006 |
| JP | 2006156187 | 6/2006 |
| JP | 20066159187 | 6/2006 |
| JP | WO 2006065558 | 6/2006 |
| JP | 20064085 | 9/2006 |
| JP | 2006525648 | 11/2006 |
| JP | 2006331683 | 12/2006 |
| JP | 2007-49019 | 2/2007 |
| JP | 2007049019 | 2/2007 |
| JP | A2007049019 | 2/2007 |
| JP | 200759930 | 3/2007 |
| JP | 2007059911 | 3/2007 |
| JP | 2007081090 | 3/2007 |
| JP | 2007/173397 A | 7/2007 |
| JP | 2007-184330 | 7/2007 |
| JP | 2007173397 | 7/2007 |
| JP | 2007184330 | 7/2007 |
| JP | 3138653 | 12/2007 |
| JP | 2008505448 | 2/2008 |
| JP | 2008-508742 | 3/2008 |
| JP | 2008508742 | 3/2008 |
| JP | 2008091140 | 4/2008 |
| JP | 2008108835 | 5/2008 |
| JP | 2008-523639 | 7/2008 |
| JP | 200815707 | 7/2008 |
| JP | 2008523639 | 7/2008 |
| JP | 2008-187195 | 8/2008 |
| JP | 2008187195 | 8/2008 |
| JP | 2008-262765 | 10/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009-016058 A | 1/2009 |
| JP | 200916689 | 1/2009 |
| JP | 2009016058 | 1/2009 |
| JP | 2009016153 | 1/2009 |
| JP | 2009021264 | 1/2009 |
| JP | 2009-59896 | 3/2009 |
| JP | 2009059896 | 3/2009 |
| JP | 2009117346 | 5/2009 |
| JP | WO 2009093163 | 7/2009 |
| JP | U 3153766 | 8/2009 |
| JP | 2009238960 | 10/2009 |
| JP | WO 2009119038 | 10/2009 |
| JP | 2009-267039 | 11/2009 |
| JP | 2009266780 | 11/2009 |
| JP | 2009277586 | 11/2009 |
| JP | 2009295299 | 12/2009 |
| JP | WO 2009148543 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | WO 2009028861 | 3/2009 |
| KR | 100944181 | 2/2010 |
| KR | 1020100037353 | 4/2010 |
| KR | 100980588 B1 | 9/2010 |
| KR | 3020110008445 | 3/2011 |
| TW | 200505054 | 2/2005 |

(56) References Cited

FOREIGN PATENT DOCUMENTS

| TW | 200507686 | 2/2005 |
|---|---|---|
| TW | 200527664 | 8/2005 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200907239 | 2/2009 |
| TW | 200928435 | 7/2009 |
| TW | 200930937 | 7/2009 |
| TW | 200938768 | 9/2009 |
| TW | 200943592 | 10/2009 |
| TW | D134005 | 3/2010 |
| TW | 100300960 | 3/2011 |
| TW | D141681 | 7/2011 |
| WO | WO 2000/017569 A1 | 3/2000 |
| WO | WO 0124583 A1 | 4/2001 |
| WO | WO 2001/040702 A1 | 6/2001 |
| WO | WO 0160119 A2 | 8/2001 |
| WO | WO 2004100213 A2 | 5/2004 |
| WO | WO 2004068599 | 8/2004 |
| WO | WO 2004/100213 A2 | 11/2004 |
| WO | WO 2004100213 | 11/2004 |
| WO | WO 2004100213 A2 | 11/2004 |
| WO | WO 2005107420 A2 | 11/2005 |
| WO | WO 2006012043 | 2/2006 |
| WO | WO 2006065558 | 6/2006 |
| WO | WO 2007/130358 A2 | 11/2007 |
| WO | WO 2007146566 A2 | 12/2007 |
| WO | WO 2008/018002 A2 | 2/2008 |
| WO | WO 2008018002 | 2/2008 |
| WO | WO 2008134056 A1 | 4/2008 |
| WO | WO 2008/052318 A1 | 5/2008 |
| WO | WO 2008/117211 A1 | 10/2008 |
| WO | WO 2008/146229 A2 | 12/2008 |
| WO | WO 2008146229 | 12/2008 |
| WO | WO 2009/024952 A2 | 2/2009 |
| WO | WO 2009052099 | 4/2009 |
| WO | WO 2009/091562 A2 | 7/2009 |
| WO | WO 2009/093163 A2 | 7/2009 |
| WO | WO 2009091562 | 7/2009 |
| WO | WO 2009093163 | 7/2009 |
| WO | WO 2009093163 A2 | 7/2009 |
| WO | WO 2009/107052 A1 | 9/2009 |
| WO | WO 2009107052 | 9/2009 |
| WO | WO 2009/119038 A2 | 10/2009 |
| WO | WO 2009/128004 A1 | 10/2009 |
| WO | WO 2009119038 | 10/2009 |
| WO | WO 2009125314 A2 | 10/2009 |
| WO | WO 2009131627 | 10/2009 |
| WO | WO 2009143047 A2 | 11/2009 |
| WO | WO 2009/158422 A1 | 12/2009 |
| WO | WO 2009158422 | 12/2009 |
| WO | WO 2009158422 A1 | 12/2009 |
| WO | WO 2010/012999 A2 | 2/2010 |
| WO | WO 2010/013893 | 2/2010 |
| WO | WO 2010012999 | 2/2010 |
| WO | WO 2010013893 | 2/2010 |
| WO | WO 2010013898 A2 | 2/2010 |
| WO | WO 2010052640 | 5/2010 |
| WO | WO 2010/119618 A1 | 10/2010 |
| WO | WO 2010/128419 A1 | 11/2010 |
| WO | WO 2011100193 | 8/2011 |
| WO | WO 2011109091 A1 | 9/2011 |
| WO | WO 2011109098 | 9/2011 |
| WO | WO 2012011279 | 1/2012 |
| WO | WO 2012031533 | 3/2012 |

OTHER PUBLICATIONS

U.S. Appl. No. 11/899,790, filed Sep. 7, 2007 Chitnis.
U.S. Appl. No. 11/473,089, filed Jun. 21, 2006 Tarsa.
U.S. Appl. No. 61/435,759, filed Jan. 24, 2011 Le.
U.S. Appl. No. 61/339,516, filed Mar. 3, 2010 Tong.
US Publication No. 2010/0155763, Filing Date Jun. 24, 2010 Donofrio.
International Search Report and Written Opinion, PCT/US2009/063804, dated Feb. 26, 2010.
U.S. Appl. No. 12/566,195, Van De Ven.
U.S. Appl. No. 12/704,730, Van De Ven.
C.Crane GEOBULB®-II LED Light Bulb, Item #2SW, Description, p. 1-2.
C.Crane GEOBULB®-II LED Light Bulb, Item #2SW, Specs, p. 1-2.
Cree LR4, 4" Recessed Architectural Downlight, Product Info p. 1-2.
Cree LR6, 6" Recessed Downlight Module, Product Info, p. 1-2.
U.S. Appl. No. 12/901,405, filed Oct. 8, 2010, Tong.
U.S. Appl. No. 61/339,515, filed Mar. 3, 2010, Tong.
U.S. Appl. No. 12/848,825, filed Aug. 2, 2010, Tong.
US Publication No. 2005/0242711 AI, Date Nov. 3, 2005 Bloomfield.
US Publication No. 2002/0047516 A1, Date Apr. 25, 2002 Iwasa.
US Publication No. 2007/0263405 A1, Date Nov. 15, 2007 Ng.
International Search Report and Written Opinion for PCT/US2011/000400 dated May 2, 2011.
Notice to Submit a Response from Korean Design Patent Application No. 30-2011-0024961, dated Sep. 10, 2012.
Cree XLAMP® XP-G LED, Product Info and Data Sheet, 14 Pages.
Cree XLAMP® XP-E LED, Product Info and Data Sheet, 20 Pages.
Notice to Submit a Response from Korean Patent Application No. 30-2011-0008448, dated Apr. 16, 2012.
Notice to Submit a Response from Korean Patent Application No. 30-2011-0008445, dated Apr. 16, 2012.
Notice to Submit a Response from Korean Patent Application No. 30-2011-0008446, dated Apr. 16, 2012.
Office Action for Taiwanese Patent Application No. 100300961, dated May 7, 2012.
Office Action from Taiwanese Patent Application No. 100300960, dated May 7, 2012.
Office Action from Patent U.S. Appl. No. 13/028,946, dated Jul. 16, 2012.
Response to OA from U.S. Appl. No. 13/028,946, filed Oct. 8, 2012.
Office Action from U.S. Appl. No. 13/029,025, dated Jul. 16, 2013.
Office Action from U.S. Appl. No. 13/430,478, dated Jun. 18, 2013.
Office Action from U.S. Appl. No. 12/901,405, dated Jul. 1, 2013.
Office Action from U.S. Appl. No. 13/018,291, dated Oct. 10, 2012.
Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013.
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/028,946, dated Dec. 4, 2012.
Response to OA from U.S. Appl. No. 13/028,946, filed Jan. 29, 2013.
Office Action from U.S. Appl. No. 13/029,005, dated Jan. 24, 2013.
Office Action from U.S. Appl. No. 12/901,405, dated Jan. 9, 2013.
Response to OA from U.S. Appl. No. 12/901,405, filed Apr. 29, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No. 13/054,501, dated May 31, 2013.
Office Action from U.S. Appl. No. 13/028,946, dated Apr. 11, 2013.
Office Action from U.S. Appl. No. 13/028,913, dated Apr. 29, 2013.
Office Action from U.S. Appl. No. 13/029,005, dated Jan. 4, 2013.
Response to OA from U.S. Appl. No. 13/029,005, filed Apr. 17, 2013.
Office Action from U.S. Appl. No. 12/848,825, dated Nov. 5, 2012.
Response to OA from U.S. Appl. No. 12/848,825, filed Feb. 5, 2013.

(56) References Cited

OTHER PUBLICATIONS

Office Action from U.S. Appl. No. 13/029,005, dated Jun. 11, 2013.
International Search Report and Written Opinion for PCT/US2011/000403 dated Aug. 23, 2011.
International Search Report and Written Opinion for PCT/US2011/000404 dated Aug. 25, 2011.
International Search Report and Written Opinion for PCT/US2011/000398 dated Aug. 30, 2011.
International Search Report and Written Opinion for PCT/US2011/000406 dated Sep. 15, 2011.
Notice of Reasons for Rejection from Japanese Patent Appl. No. 2012-543086, dated Aug. 27, 2013.
International Search Report and Written Opinion for PCT Application No. PCT/US2011/000391 dated Oct. 6, 2011.
International Search Report and Written Opinion for PCT Application No. PCT/US2011/000402 dated Sep. 30, 2011.
International Search Report and Written Opinion from PCT Application No. PCT/US2012/044705 dated Oct. 9, 2012.
Notice to Submit a Response from Korean Patent Application No. 30-2011-0008446, dated Oct. 22, 2012.
International Search Report and Written Opinion for PCT Application No. PCT/US2011/000399 dated Jul. 12, 2011.
Decision to Refuse a European Patent Application for EP 09 152 962.8 dated Jul. 6, 2011.
Search Report and Written Opinion from PCT Application No. PCT/US2012/072108, dated Feb. 27, 2013.
International Search Report and Written Opinion for PCT Application No. PCT/US2011/000397 dated May 24, 2011.
International Search Report and Written Opinion for PCT Application No. PCT/US2010/003146 dated Jun. 7, 2011.
Decision for Final Rejection for Japanese Patent Application No. 2001-542133 dated Jun. 28, 2011.
International Search Report and Written Opinion for PCT Patent Application No. PCT/US2011/000405 dated Nov. 2, 2011.
International Search Report and Written Opinion for PCT/US2011/000407 dated Nov. 16, 2011.
Office Action of the IPO for Taiwan Patent Application No. TW 100300962 dated Nov. 21, 2011.
Office Action of the IPO for Taiwan Patent Application No. TW 100300961 dated Nov. 16, 2011.
Office Action of the IPO for Taiwan Patent Application No. TW 100300960 dated Nov. 15, 2011.
Office Action of the IPO for Taiwan Patent Application No. TW 100302770 dated Jan. 13, 2012.
International Search Report and Written Opinion from PCT Application No. PCT/US2011/000389, dated May 6, 2013.
International Search Report and Written Opinion from PCT Application No. PCT/US2011/000390, dated May 6, 2013.
International Preliminary Report on Patentability from PCT/US2011/00389, dated May 8, 2013.
International Preliminary Report on Patentability from PCT/US2011/000390, dated May 8, 2013.
Reasons for Rejection from Japanese Patent Appl. No. 2011-198454, dated Mar. 7, 2013.
Office Action from Japanese Patent appl. No. 2012-556063, dated Jan. 28, 2014.
Comments on the Written Opinion and Amendment of the Application from European Patent appl. No. 12740244.4, dated Feb. 20, 2014.
International Search Report and Written Opinion from PCT/US2013/057712 dated Feb. 4, 2014.
Office Action from U.S. Appl. No. 11/149,999, dated Jan. 15, 2014.
Office Action from U.S. Appl. No. 13/034,501, dated Jan. 23, 2014.
Decision of Dismissal of Amendment, Decision of Rejection from Japanese Patent Appl. No. 2011-231319, dated Oct. 15, 2013.
Office Action from Japanese Patent Appl. No. 2012-556063, dated Oct. 11, 2013.
Office Action from Japanese Patent Appl. No. 2012-556066, dated Oct. 25, 2013.
Office Action from Japanese Patent Appl. No. 2012-556065, dated Oct. 25, 2013.
Office Action from Patent U.S. Appl. No. 13/028,913, dated Nov. 4, 2013.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
Office Action from Japanese Patent Appl. No. 2012-556064, dated Oct. 29, 2013.
Office Action from U.S. Appl. No. 13./029,063, dated Oct. 23, 2013.
Office Action from U.S. Appl. No. 13/028,946, dated Oct. 31, 2013.
Office Action from U.S. Appl. No. 13/029,025, dated Dec. 6, 2013.
Office Action from Japanese Patent Appl. No. 2012-556066, dated Mar. 14, 2014.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149,999, filed Sep. 13, 2013.
Office Action from U.S. Appl. No. 12/985,275, dated Aug. 27, 2013.
Office Action from U.S. Appl. No. 13/358,901, dated Oct. 9, 2013.
Office Action from U.S. Appl. No. 13/028,863, dated Jul. 30, 2013.
First Office Action from Chinese Patent Appl. No. 201080062056. X, dated Feb. 12, 2014.
Office Action from U.S. Appl. No. 13/028,913, dated Feb. 19, 2014.
Office Action from U.S. Appl. No. 13/028,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/034,501, dated May 5, 2014.
Office Action from U.S. Appl. No. 13/022,490, dated May 6, 2014.
Office Action from U.S. Appl. No. 13/028,863, dated May 9, 2014.
First Office Action from Chinese Patent Application No. 2011800207069, dated May 5, 2014.
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/028,946, dated May 27, 2014.
Office Action from U.S. Appl. No. 13/028,913, dated May 22, 2014.
Office Action from U.S. Appl. No. 13/018,245, dated Jun. 10, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2014.
Office Action from Japanese Patent Appl. No. 2012-556065, dated Aug. 5, 2014.
Office Action from Japanese Patent Appl. No. 2012-556062, dated Aug. 5, 2014.
First Office Action from Chinese Patent Appl. No. 2011800223837, dated Jul. 24, 2014.
Office Action from European Patent Appl. No. 11710906.6-1757, dated Sep. 10, 2014.

(56) References Cited

OTHER PUBLICATIONS

First Office Action and Search Report from Chinese Patent Appl. No. 201180022620X, dated Jul. 1, 2014.
Office Action from U.S. Appl. No. 13/358,901, dated Jul. 15, 2014.
Response to OA from U.S. Appl. No. 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 13/029,025, dated Aug. 6, 2014.
Office Action from U.S. Appl. No. 12/985,275, dated Aug. 7, 2014.
Office Action from U.S. Appl. No. 12/901,405, dated Aug. 7, 2014.
First Office Action from Chinese Appl. No. 201180022626.7. dated Nov. 15, 2014.
Second Office Action from Chinese Appl. No. 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/029,025, dated Dec. 11, 2014.
Office Action from U.S. Appl. No. 13/018,245, dated Dec. 11, 2014.
Office Action from U.S. Appl. No. 12/985,275, dated Dec. 29, 2014.
Summons to Oral Proceedings from European Patent Appl. No. 09152962/2166580, dated Jan. 29, 2015.
First Office Action from Chinese Patent Appl. No. 2011800226214, dated Dec. 25, 2014.
First Office Action from Chinese Patent Appl. No. 2011800225832, dated Jan. 20, 2015.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Office Action from U.S. Appl. No. 13/028,863, dated Nov. 10, 2014.
Decision to Grant from Japanese Appl. No. 2012-556062, dated Nov. 27, 2014.
Second Office Action from Chinese Patent Appl. No. 2011800207069, dated Dec. 5, 2014.
Search Report and Office Action from Taiwanese Patent Appl. No. 099143827, dated Jun. 12, 2015.
Office Action from Taiwanese Patent Appl. No. 100107012, dated Jul. 22, 2015.
Decision of Board of Appeal and Minutes of Oral Proceedings from European Appl. No. 09152962, dated Jun. 2, 2015.
Decision to Grant from Chinese Patent Appl. No. 201080062056.X, dated Jul. 6, 2015.
Office Action from Taiwanese Appl. No. 101107038, dated Jul. 21, 2015.
Office Action from Taiwanese Patent Appl. No. 100107042, dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044, dated Jun. 1, 2015.
Third Office Action from Chinese Patent Appl. No. 201180022606X, dated Jun. 10, 2015.
Second Office Action and Search Report from Chinese Patent Appl. No. 2011800207092, dated Jan. 22, 2015.
Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757, dated Feb. 9, 2015.
Office Action from U.S. Appl. No. 13/029,063, dated Jan. 13, 2015.
Office Action from U.S. Appl. No. 14/014,272, dated Jan. 14, 2015.
Response to OA from U.S. Appl. No. 14/014,272, filed Mar. 3, 2015.
Office Action from U.S. Appl. No. 12/901,405, dated Feb. 4, 2015.
Office Action from Japanese Patent Appl. No. 2014-122643, dated Apr. 10, 2015.
Second Office Action from Chinese Patent Appl. No. 2011800223856, dated Apr. 16, 2015.
Office Action from Taiwanese Patent Appl. No. 100107048, dated Apr. 24, 2015.
Notice of Decline of Amendments and Final Office Action from Japanese Appl. No. 2012-556065, dated Apr. 10, 2015.
Second Office Action from Chinese Patent Appl No. 2011800223837, dated Apr. 13, 2015.
Communication from European Patent Appl. No. 13762957.2-1757, dated Apr. 30, 2015.
Office Action and Search Report from Taiwanese Patent Appl. No. 100107051, dated May 12, 2015.
Third Office Action from Chinese Patent Appl. No. 2011800207069, dated Apr. 13, 2015.
Second Office Action from Chinese Patent Appl. No. 2011800226248, dated May 4, 2015.
Office Action from Taiwanese Appl. No. 100107047, dated Jun. 5, 2015.
Second Office Action from Chinese Appl. No. 201180022620X, dated Apr. 20, 2015.
Office Action from Taiwanese Appl. No. 100107040, dated Jun. 5, 2015.
Office Action from Taiwanese Patent Appl. No. 10420724800, dated Jun. 2, 2015.
Office Action from U.S. Appl. No. 11/149,999, dated Mar. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/029,025, dated Apr. 29, 2015.
Office Action from U.S. Appl. No. 13/018,245, dated May 28, 2015.
Office Action from U.S. Appl. No. 13/028,863, dated Jun. 3, 2015.
Office Action from U.S. Appl. No. 13/758,763, dated Jun. 5, 2015.
Office Action from U.S. Appl. No. 14/185,123, dated Jun. 9, 2015.
Third Office Action from Chinese Patent Appl. No. 2011800207392, dated Jul. 13. 2015.
Notice of Allowance from Japanese Patent Appl. No. 2014-122643, dated Sep. 3, 2015.
Notification of the Fourth Office Action from Chinese Patent Appl. No. 2011800207069, dated Aug. 24, 2015.
Decision of Rejection from Japanese Patent Appl. No. 2012-566065, dated Aug. 18, 2015.
Second Office Action from Chinese Patent Appl. No. 2011800226267, dated Aug. 3, 2015.
Office Action from U.S. Appl. No. 13/029,025, dated Aug. 17, 2015.
Office Action from U.S. Appl. No. 13/430,478, dated Aug. 27, 2015.
Office Action from U.S. Appl. No. 12/985,275, dated Sep. 2, 2015.
Office Action from U.S. Appl. No. 13/029,063, dated Sep. 17, 2015.
Office Action from U.S. Appl. No. 11/149,999, dated Oct. 1, 2015.
Examination from European Patent Appl. No. 10799139.0, dated Nov. 18, 2015.
Request for Correction from Chinese Patent Appl. No. 201180022606X, dated Nov. 12, 2015.
Third Office Action from Chinese Patent Appl. No. 2011800223856, dated Nov. 2, 2015.
Office Action from U.S. Appl. No. 13/536,707, dated Nov. 16, 2015.
Office Action from U.S. Appl. No. 14/185,123, dated Nov. 17, 2015.
Office Action from U.S. Appl. No. 14/453,482, dated Oct. 1, 2015.
Office Action from U.S. Appl. No. 14/108,815, dated Nov. 5, 2015.
Office Action from Chinese Patent Appl. No. 201180022583.2, dated Dec. 17, 2015.
Third Office Action from Chinese Patent Appl. No. 2011800223856— translations only, original already submitted.
Official Notification and Search Report from Taiwanese Patent appl. No. 10421609300, dated Dec. 1, 2015.
Official Notification and Search Report from Taiwanese Patent appl. No. 10421621560, dated Dec. 2, 2015.
Third Office Action from Chinese Patent Appl. No. 2011800226248, dated Nov. 20, 2015.
Official Notification and Search Report from Taiwanese Patent appl. No. 10421651990, dated Dec. 7, 2015.
Notice of Issuance from Chinese Patent Appl. No. 2011800226063X, dated Dec. 10, 2015.
Official Notification and Search Report from Taiwanese Patent Appl. No. 10421595210, dated Nov. 27, 2015.

(56) References Cited

OTHER PUBLICATIONS

Examination from European Patent appl. No. 11 710 906.6-1757, dated Jan. 8, 2016.
Examination from European Patent appl. No. 11 710 348.1-1757, dated Jan. 8, 2016.
Office Action from U.S. Appl. No. 13/029,025; dated Jan. 6, 2016.
Office Action from U.S. Appl. No. 13/430,478; dated Jan. 7, 2016.
Office Action from U.S. Appl. No. 13/758,763; dated Feb. 2, 2016.
Office Action from U.S. Appl. No. 13/029,063; dated Feb. 11, 2016.
Fourth Office Action from Chinese Patent Appl. No. 201180020709.2, dated Jan. 25, 2016.
Decision of Rejection from Chinese Patent Appl. No. 201280020706.9, dated Mar. 2, 2016.
Re-Examination Report from Japanese Patent Appl. No. 2012-556065, dated Feb. 1, 2016.
Examination Report from European Patent Appl. No. 11 709 509.1-1757, dated Mar. 4, 2016.
Office Action from U.S. Appl. No. 13/758,763; dated Feb. 2, 2616.
Office Action from U.S. Appl. No. 12/985,275; dated Feb. 18, 2016.
Office Action from U.S. Appl. No. 14/453,482: dated Apr. 1, 2016.
Third Office Action for Chinese Application No. 2011800225832; dated Jul. 7, 2016.
Third Office Action for Chinese Application No. 2011800226267: dated Apr. 6, 2016.
Office Action from U.S. Appl. No. 14/108,815; dated Apr. 27, 2016.
Fourth Office Action for Chinese Application No. 2011800223856; dated May 5, 2016.
Fourth Office Action for Chinese Application No. 201180022624.8; dated May 24, 2016.
Fourth Office Action for Chinese Application No. 2011800223837; dated Jun. 6, 2016.
Office Action from U.S. Appl. No. 13/536,707: dated Jun. 23, 2016.
Decision of Rejection for Chinese Appl. 2011800223856: dated Jan. 5, 2017.
Office Action for Chinese Appl. 2011800225832; dated Feb. 4, 2017.
Office Action for Chinese Application No. 201180022383.7; dated Mar. 15, 2017.
Office Action for European Application No. 1570564.5; dated Mar. 15, 2017.
Office Action for European Application No. 10799139.0; dated Mar. 31, 2017.
Office Action for U.S. Appl. No. 13/758,763; dated Apr. 5, 2017.
Office Action for U.S. Appl. No. 14/108,815; dated Apr. 28, 2017.
Office Action for U.S. Appl. No. 14/453,482; dated Apr. 20, 2017.
Office Action for Japanese Application No. 2012-556065; dated Jun. 16, 2017.
Office Action for Chinese Application No. 201180022620; dated Jun. 26, 2017.
Office Action for U.S. Appl. No. 13/536,707; dated Jun. 30, 2017.
Office Action for U.S. Appl. No. 13/029,063; dated Aug. 2, 2017.
Office Action for U.S. Appl. No. 14/108,815; dated Aug. 4, 2017.
Office Action for U.S. Appl. No. 13/758,763; dated Oct. 17, 2017.
Office Action for U.S. Appl. No. 14/453,482; dated Oct. 19, 2017.
Office Action for Japanese Application No. 2012-556065; dated Oct. 24, 2017.
Office Action for U.S. Appl. No. 14/108,815; dated Jan. 5, 2018.
Office Action for Chinese Application No. 2011800225832; dated Dec. 14, 2017.
Office Action for U.S. Appl. No. 13/536,707; dated Feb. 22, 2018.
Foreign Office Action for Chinese Application No. 201180022583.2; dated Apr. 4, 2018.
Office Action for U.S. Appl. No. 14/453,482; dated May 18, 2018.
Office Action for U.S. Appl. No. 14/108,815; dated May 24, 2018.
Office Action for U.S. Appl. No. 13/758,763; dated Jun. 14, 2018.
Office Action for U.S. Appl. No. 13/536,707; dated Jul. 10, 2018.
Office Action for Chinese Application No. 2015800540943; dated Apr. 28, 2018.
"Design and Manufacturing of Integrated Multi-chip Light-Emitting Diodes Packages" Li Zongtao, 2003, vol. 11, pp. 46-57, dated Nov. 15, 2013.
Foreign Office Action for Japanese Appl. No. 2012-556065; dated Nov. 22, 2016.
Foreign Office Action for Chinese Appl. No. 2011800207069; dated Nov. 29, 2016.
Foreign Office Action for Chinese Appl. No. 201180022620; dated Dec. 1, 2016.
Foreign Office Action for Chinese Appl. No. 2011800226267; dated Dec. 15, 2016.
Notice of Allowance for Chinese Application No. 201180022624.8; dated Jan. 3, 2017.
Notice of Issuance for Chinese Application No. 201180020709.2; dated Jul. 25, 2016.
Office Action for U.S. Appl. No. 13/758,763; dated Jul. 26, 2016.
European Office Action for Application No. 11710348.1; dated Aug. 8, 2016.
Office Action for U.S. Appl. No. 12/985,275; dated Aug. 30, 2016.
Office Action for U.S. Appl. No. 13/029,063; dated Sep. 8, 2016.

\* cited by examiner

SOLID STATE LAMP WITH THERMAL SPREADING ELEMENTS AND LIGHT DIRECTING OPTICS

This application claims the benefit of U.S. Provisional Patent Application Ser. No. 61/339,516, filed on Mar. 3, 2010, U.S. Provisional Patent Application Ser. No. 61/339,515, filed on Mar. 3, 2010, U.S. Provisional Patent Application Ser. No. 61/386,437, filed on Sep. 24, 2010, U.S. Provisional Application Ser. No. 61/424,665, filed on Dec. 19, 2010, U.S. Provisional Application Ser. No. 61/424,670, filed on Dec. 19, 2010, U.S. Provisional Patent Application Ser. No. 61/434,355, filed on Jan. 19, 2011, U.S. Provisional Patent Application Ser. No. 61/435,326, filed on Jan. 23, 2011, U.S. Provisional Patent Application Ser. No. 61/435,759, filed on Jan. 24, 2011. This application is also a continuation-in-part from, and claims the benefit of, U.S. patent application Ser. No. 14/848,825, filed on Aug. 2, 2010 now U.S. Pat. No. 8,562,161, U.S. patent application Ser. No. 12/889,719, filed on Sep. 24, 2010, and U.S. patent application Ser. No. 12/975,820, filed on Dec. 22, 2010.

BACKGROUND OF THE INVENTION

Field of the Invention

This invention relates to solid state lamps and bulbs and in particular to efficient and reliable light emitting diode (LED) based lamps and bulbs capable of producing omnidirectional emission patterns.

Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

LED chips which have a conversion material in close proximity or as a direct coating have been used in a variety of different packages, but experience some limitations based on the structure of the devices. When the phosphor material is on or in close proximity to the LED epitaxial layers (and in some instances comprises a conformal coat over the LED), the phosphor can be subjected directly to heat generated by the chip which can cause the temperature of the phosphor material to increase. Further, in such cases the phosphor can be subjected to very high concentrations or flux of incident light from the LED. Since the conversion process is in general not 100% efficient, excess heat is produced in the phosphor layer in proportion to the incident light flux. In compact phosphor layers close to the LED chip, this can lead to substantial temperature increases in the phosphor layer as large quantities of heat are generated in small areas. This temperature increase can be exacerbated when phosphor particles are embedded in low thermal conductivity material such as silicone which does not provide an effective dissipation path for the heat generated within the phosphor particles. Such elevated operating temperatures can cause degradation of the phosphor and surrounding materials over time, as well as a reduction in phosphor conversion efficiency and a shift in conversion color.

Lamps have also been developed utilizing solid state light sources, such as LEDs, in combination with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

One potential disadvantage of lamps incorporating remote phosphors is that they can have undesirable visual or aesthetic characteristics. When the lamps are not generating light the lamp can have a surface color that is different from the typical white or clear appearance of the standard Edison bulb. In some instances the lamp can have a yellow or orange appearance, primarily resulting from the phosphor conversion material, such as yellow/green and red phosphors. This appearance can be considered undesirable for many applications where it can cause aesthetic issues with the surrounding architectural elements when the light is not illuminated. This can have a negative impact on the overall consumer acceptance of these types of lamps.

Further, compared to conformal or adjacent phosphor arrangements where heat generated in the phosphor layer during the conversion process may be conducted or dissipated via the nearby chip or substrate surfaces, remote phosphor arrangements can be subject to inadequate thermally conductive heat dissipation paths. Without an effective heat dissipation pathway, thermally isolated remote phosphors may suffer from elevated operating temperatures that in some instances can be even higher than the temperature in comparable conformal coated layers. This can offset some or all of the benefit achieved by placing the phosphor remotely with respect to the chip. Stated differently, remote phosphor placement relative to the LED chip can reduce or eliminate direct heating of the phosphor layer due to heat generated within the LED chip during operation, but the resulting phosphor temperature decrease may be offset in part or entirely due to heat generated in the phosphor layer itself during the light conversion process and lack of a suitable thermal path to dissipate this generated heat.

Another issue affecting the implementation and acceptance of lamps utilizing solid state light sources relates to the nature of the light emitted by the light source itself. In order to fabricate efficient lamps or bulbs based on LED light sources (and associated conversion layers), it is typically desirable to place the LED chips or packages in a co-planar arrangement. This facilitates manufacture and can reduce manufacturing costs by allowing the use of conventional production equipment and processes. However, co-planar arrangements of LED chips typically produce a forward directed light intensity profile (e.g., a Lambertian profile). Such beam profiles are generally not desired in applications where the solid-state lamp or bulb is intended to replace a conventional lamp such as a traditional incandescent bulb, which has a much more omni-directional beam pattern. While it is possible to mount the LED light sources or packages in a three-dimensional arrangement, such arrangements are generally difficult and expensive to fabricate.

SUMMARY OF THE INVENTION

The present invention provides lamps and bulbs generally comprising different combinations and arrangement of a light source, one or more wavelength conversion materials, regions or layers which are positioned separately or remotely with respect to the light source, and a separate diffusing layer. This arrangement allows for the fabrication of lamps and bulbs that are efficient, reliable and cost effective and can provide an essentially omni-directional emission pattern, even with a light source comprised of a co-planar arrangement of LEDs. The lamps according to the present invention can also comprise thermal management features that provide for efficient dissipation of heat from the LEDs, which in turn allows the LEDs to operate at lower temperatures. The lamps can also comprise optical elements to help change the emission pattern from the generally directional (e.g. Lambertian) pattern of the LEDs to a more omnidirectional pattern.

One embodiment of a solid state lamp according to the present invention comprises an LED and an optical element over said LED such that light from the LED interacts with the optical element. The optical element changes the emission pattern of the LED to a broader emission pattern. The lamp also comprises a phosphor carrier over the optical element, with the phosphor carrier converting at least some of the LED light to a different wavelength.

Another embodiment of a solid state lamp according to the present invention comprises a heat dissipation element with a dielectric layer on the heat dissipation element. A heat spreading substrate is included on the dielectric layer, and an LED is included on and in thermal contact with the heat spreading substrate. The heat spreading substrate is arranged to spread heat from the LED prior to the LED heat reaching the dielectric layer.

Still another embodiment of a solid state lamp according to the present invention comprises an array of solid state emitters emitting light in a substantially directional emission pattern. A three-dimensional optical element is included over the array of solid state light emitters, the optical element modifying the directional emission pattern of the array of solid state light emitters to a more omni-directional emission pattern. A portion of light from the solid state light emitters provides forward light emission for the lamp emission pattern.

These and other aspects and advantages of the invention will become apparent from the following detailed description and the accompanying drawings which illustrate by way of example the features of the invention.

DETAILED DESCRIPTION OF THE INVENTION

Figure 1:
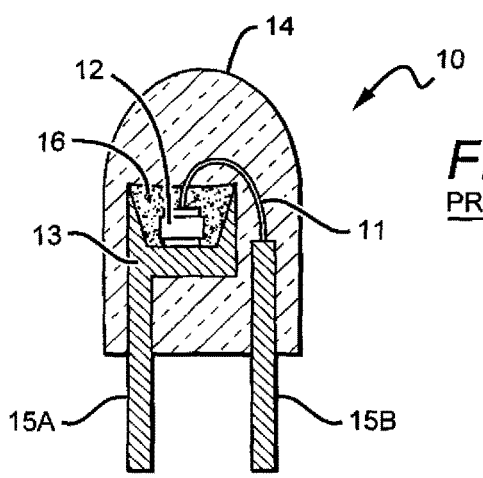
FIG. 1 shows a sectional view of one embodiment of a prior art LED lamp.
Figure 2:
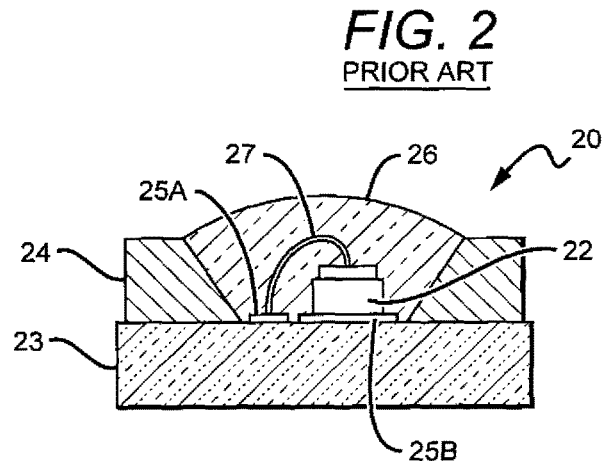
FIG. 2 shows a sectional view of another embodiment of a prior art LED lamp.

The present invention is directed to different embodiments of lamp or bulb structures that are efficient, reliable and cost effective, and that in some embodiments can provide an essentially omnidirectional emission pattern from directional emitting light sources, such as forward emitting light sources. The present invention is also directed to lamp structures using solid state emitters with remote conversion materials (or phosphors) and remote diffusing elements or diffusers. In some embodiments, the diffuser not only serves to mask the phosphor from the view by the lamp user, but can also disperse or redistribute the light from the remote phosphor and/or the lamp's light source into a desired emission pattern. In some embodiments the diffuser dome can be arranged to disperse forward directed emission pattern into a more omnidirectional pattern useful for general lighting applications. The diffuser can be used in embodiments having two-dimensional as well as three-dimensional shaped remote conversion materials, with a combination of features capable of transforming forward directed emission from an LED light source into a beam profile comparable with standard incandescent bulbs.

The present invention is described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

Some embodiments of lamps can have a dome-shaped (or frusto-spherical shaped) three dimensional conversion material over and spaced apart from the light source, and a dome-shaped diffuser spaced apart from and over the conversion material, such that the lamp exhibits a double-dome structure. The spaces between the various structure can comprise light mixing chambers that can promote not only dispersion of, but also color uniformity of the lamp emission. The space between the light source and conversion material, as well as the space between the conversion material, can serve as light mixing chambers. Other embodiments can comprise additional conversion materials or diffusers that can form additional mixing chambers. The order of the dome conversion materials and dome shaped diffusers can be different such that some embodiments can have a diffuser inside a conversion material, with the spaces between forming light mixing chambers. These are only a few of the many different conversion materials and diffuser arrangement according to the present invention.

Some lamp embodiments according to the present invention can comprise a light source having a co-planar arrangement of one or more LED chips or packages, with the emitters being mounted on a flat or planar surface. In other embodiments, the LED chips can be non co-planar, such as being on a pedestal or other three-dimensional structure. Co-planar light sources can reduce the complexity of the emitter arrangement, making them both easier and cheaper to manufacture. Co-planar light sources, however, tend to emit primarily in the forward direction such as in a Lambertian emission pattern. In different embodiments it can be desirable to emit a light pattern mimicking that of conventional incandescent light bulbs that can provide a nearly uniform emission intensity and color uniformity at different emission angles. Different embodiments of the present invention can comprise features that can transform the emission pattern from the non-uniform to substantially uniform within a range of viewing angles.

Figure 3:
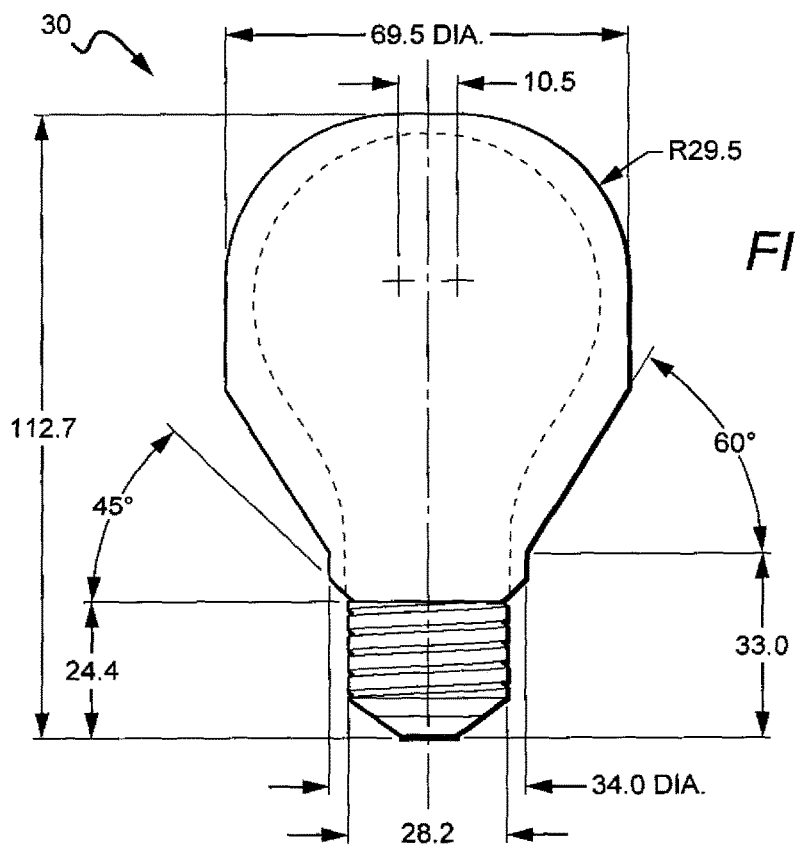
FIG. 3 shows the size specifications for an A19 replacement bulb.

Different embodiments of the lamps can have many different shapes and sizes, with some embodiments having dimensions to fit into standard size envelopes, such as the A19 size envelope 30 as shown in FIG. 3. This makes the lamps particularly useful as replacements for conventional incandescent and fluorescent lamps or bulbs, with lamps according to the present invention experiencing the reduced energy consumption and long life provided from their solid state light sources. The lamps according to the present invention can also fit other types of standard size profiles including but not limited to A21 and A23. The lamp having high efficiency and low manufacturing cost.

The present invention comprises an efficient heat dissipation system that serves to laterally spread heat from the LED chips prior to encountering any dielectric layers. This allows the LEDs to operate at lower temperatures. Some embodiments of a thermally efficient heat dissipation system can comprise many different elements arranged in many different ways. Some embodiments comprise a heat-spreading substrate with high thermal conductivity that serves to laterally spread heat from the LED chips prior to encountering any dielectric layers. The heat dissipation system can also comprise a dielectric layer mounted on a heat dissipation element such as a heat sink or heat pipe. By spreading the LED heat prior to encountering the dielectric layer, the impact of the dielectric layer's thermal resistance is minimized.

An optical element can be included that efficiently guides or reflects light from multiple co-planar LED chips, into a specified beam profile with minimal light loss. The lamps according to the present invention can comprise one or more remotely located phosphors and/or diffusers that can be included over the optical elements with the phosphor carrier converting at least part of the light emitted by the LED chip(s) into light of different wavelength. The phosphor carrier can also be arranged so as to minimize heating and saturation of the phosphor grains in the phosphor carrier. A diffuser can also be included over the phosphor carrier to further disperse light into the desired emission pattern.

In some embodiments the light sources can comprise solid state light sources, such as different types of LEDs, LED chips or LED packages. In some embodiments a single LED chip or package can be used, while in others multiple LED chips or packages can be arranged in different types of arrays. By having the phosphor thermally isolated from LED chips and with good thermal dissipation, the LED chips can be driven by higher current levels without causing detrimental effects to the conversion efficiency of the phosphor and its long term reliability. This can allow for the flexibility to overdrive the LED chips to lower the number of LEDs needed to produce the desired luminous flux. This in turn can reduce the cost on complexity of the lamps. These LED packages can comprise LEDs encapsulated with a material that can withstand the elevated luminous flux or can comprise unencapsulated LEDs.

The present invention is described herein with reference to certain embodiments, but it is understood that the invention can be embodied in many different forms and should not be construed as limited to the embodiments set forth herein. In particular, the present invention is described below in regards to certain lamps having one or multiple LEDs or LED chips or LED packages in different configurations, but it is understood that the present invention can be used for many other lamps having many different configurations. Examples of different lamps arranged in different ways according to the present invention are described below and in U.S. Provisional Patent application Ser. No. 61/435,759, to Le et al., entitled "Solid State Lamp", filed on Jan. 24, 2011, and incorporated herein by reference.

The embodiments below are described with reference to LED of LEDs, but it is understood that this is meant to encompass LED chips and LED packages. The components can have different shapes and sizes beyond those shown and different numbers of LEDs can be included. It is also understood that the embodiments described below are utilize co-planar light sources, but it is understood that non co-planar light sources can also be used. It is also understood that the lamp's LED light source may be comprised of one or multiple LEDs, and in embodiments with more than one LED, the LEDs may have different emission wavelengths. Similarly, some LEDs may have adjacent or contacting phosphor layers or regions, while others may have either adjacent phosphor layers of different composition or no phosphor layer at all.

The present invention is described herein with reference to conversion materials, phosphor layers and phosphor carriers and diffusers being remote to one another. Remote in this context refers being spaced apart from and/or to not being on or in direct thermal contact.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The different embodiments of the present invention described herein can be used as a basis for the manufacture and production of efficient, low cost LED-based solid state lamps. One example that can be enabled by the present invention can be the large scale replacement of conventional tungsten based omni-directional light bulbs (also known as "A-lamps") with more efficient, longer lasting LED based lamps or bulbs. The general concept and innovations described herein can also be applied to the replacement of a variety of similar tungsten/halogen based lamps or bulbs with corresponding LED based lamps or bulbs.

The present invention is also directed to particular independent LED lamp related devices such as LED substrates and optical elements. These can be provided to lamp designers and manufactures to incorporate into many different lamp or bulb designs beyond those described herein, with those lamps or bulbs operating pursuant to the innovations described herein. Combinations of the different inventive features could also be provided as "light engines" that can be utilized in different lighting designs. For example, a compact, single chip lamp incorporating an LED, heat spreading substrate, optional optical element, optional dielectric layer, and remote phosphor carrier could be provided as a unit to be incorporated into other lighting designs, all of which would operate pursuant to the innovations described herein.

Figure 4:
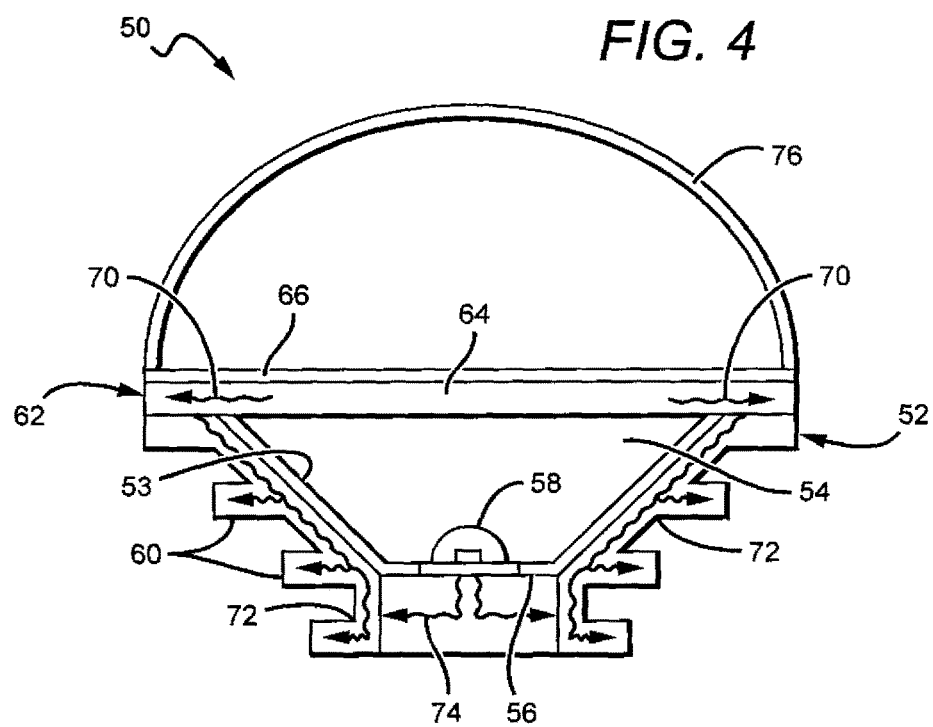
FIG. 4 is a sectional view of one embodiment of a lamp according to the present invention.

FIG. 4 shows one embodiment of a lamp 50 according to the present invention that comprises a heat sink structure 52 having an optical cavity 54 with a platform 56 for holding a light source 58. Although this embodiment and some embodiments below are described with reference to an optical cavity, it is understood that many other embodiments can be provided without optical cavities. These can include, but are not limited to, light sources being on a planar surface of the lamp structure or on a pedestal. The light source 58 can comprise many different emitters with the embodiment shown comprising an LED. Many different commercially available LED chips or LED packages can be used including but not limited to those commercially available from Cree, Inc. located in Durham, N.C. It is understood that lamp embodiments can be provided without a optical cavity, with the LEDs mounted in different ways in these other embodiments. By way of example, the light source can be mounted to a planar surface in the lamp or a pedestal can be provided for holding the LEDs.

The light source 58 can be mounted to the platform using many different known mounting methods and materials with light from the light source 58 emitting out the top opening of the cavity 54. In some embodiments light source 58 can be mounted directly to the platform 56, while in other embodiments the light source can be included on a submount or printed circuit board (PCB) that is then mounted to the platform 56. The platform 56 and the heat sink structure 52 can comprise electrically conductive paths for applying an electrical signal to the light source 58, with some of the conductive paths being conductive traces or wires. Portions of the platform 56 can also be made of a thermally conductive material and in some embodiments heat generated during operation can spread to the platform and then to the heat sink structure.

The heat sink structure 52 can at least partially comprise a thermally conductive material, and many different thermally conductive materials can be used including different metals such as copper or aluminum, or metal alloys. Copper can have a thermal conductivity of up to 400 W/m-k or more. In some embodiments the heat sink can comprise high purity aluminum that can have a thermal conductivity at room temperature of approximately 210 W/m-k. In other embodiments the heat sink structure can comprise die cast aluminum having a thermal conductivity of approximately 200 W/m-k. The heat sink structure 52 can also comprise other heat dissipation features such as heat fins 60 that increase the surface area of the heat sink to facilitate more efficient dissipation into the ambient. In some embodiments, the heat fins 60 can be made of material with higher thermal conductivity than the remainder of the heat sink. In the embodiment shown the fins 60 are shown in a generally horizontal orientation, but it is understood that in other embodiments the fins can have a vertical or angled orientation. In still other embodiments, the heat sink can comprise active cooling elements, such as fans, to lower the convective thermal resistance within the lamp. In some embodiments, heat dissipation from the phosphor carrier is achieved through a combination of convection thermal dissipation and conduction through the heat sink structure 52. Different heat dissipation arrangements and structures are described in U.S. Provisional Patent Application Ser. No. 61/339,516, to Tong et al., entitled "LED Lamp Incorporating Remote Phosphor With Heat Dissipation Feature," also assigned to Cree, Inc. application and is incorporated herein by reference.

Reflective layers 53 can also be included on the heat sink structure 52, such as on the surface of the optical cavity 54. In those embodiments not having an optical cavity the reflective layers can be included around the light source. In some embodiments the surfaces can be coated with a material having a reflectivity of approximately 75% or more to the lamp visible wavelengths of light emitted by the light source 58 and/or wavelength conversion material ("the lamp light"), while in other embodiments the material can have a reflectivity of approximately 85% or more to the lamp light. In still other embodiments the material can have a reflectivity to the lamp light of approximately 95% or more.

The heat sink structure 52 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, which can comprise a screw-threaded portion which can be screwed into an Edison socket. In other embodiments, it can include a standard plug and the electrical receptacle can be a standard outlet, or can comprise a GU24 base unit, or it can be a clip and the electrical receptacle can be a receptacle which receives and retains the clip (e.g., as used in many fluorescent lights). These are only a few of the options for heat sink structures and receptacles, and other arrangements can also be used that safely deliver electricity from the receptacle to the lamp 50. The lamps according to the present invention can comprise a power supply or power conversion unit that can comprise a driver to allow the bulb to run from an AC line voltage/current and to provide light source dimming capabilities. In some embodiments, the power supply can comprise an offline constant-current LED driver using a non-isolated quasi-resonant flyback topology. The LED driver can fit within the lamp and in some embodiments can comprise a less than 25 cubic centimeter volume, while in other embodiments it can comprise an approximately 20 cubic centimeter volume. In some embodiments the power supply can be non-dimmable but is low cost. It is understood that the power supply used can have different topology or geometry and can be dimmable as well.

A phosphor carrier 62 is included over the top opening of the cavity 54 and a dome shaped diffuser 76 is included over the phosphor carrier 62. In the embodiment shown phosphor carrier covers the entire opening and the cavity opening is shown as circular and the phosphor carrier 62 is a circular disk. It is understood that the cavity opening and the phosphor carrier can be many different shapes and sizes. It is also understood that the phosphor carrier 62 can cover less than all of the cavity opening. As further described below, the diffuser 76 is arranged to disperse the light from the phosphor carrier and/or LED into the desired lamp emission pattern and can comprise many different shapes and sizes depending on the light it receives from and the desired lamp emission pattern.

Embodiments of phosphor carriers according to the present invention can be characterized as comprising a conversion material and thermally conductive light transmitting material, but it is understood that phosphor carriers can also be provided that are not thermally conductive. The light transmitting material can be transparent to the light emitted from the light source 58 and the conversion material should be of the type that absorbs the wavelength of light from the light source and re-emits a different wavelength of light. In the embodiment shown, the thermally conductive light transmitting material comprises a carrier layer 64 and the conversion material comprises a phosphor layer 66 on the phosphor carrier. As further described below, different embodiments can comprise many different arrangements of the thermally conductive light transmitting material and the conversion material.

When light from the light source 58 is absorbed by the phosphor in the phosphor layer 66 it is re-emitted in isotropic directions with approximately 50% of the light emitting forward and 50% emitting backward into the cavity 54. In prior LEDs having conformal phosphor layers, a significant portion of the light emitted backwards can be directed back into the LED and its likelihood of escaping is limited by the extraction efficiency of the LED structure. For some LEDs the extraction efficiency can be approximately 70%, so a percentage of the light directed from the conversion material back into the LED can be lost. In the lamps according to the present invention having the remote phosphor configuration with LEDs on the platform 56 at the bottom of the cavity 54 a higher percentage of the backward phosphor light strikes a surface of the cavity instead of the LED. Coating these services with a reflective layer 53 increases the percentage of light that reflects back into the phosphor layer 66 where it can emit from the lamp. These reflective layers 53 allow for the optical cavity to effectively recycle photons, and increase the emission efficiency of the lamp. It is understood that the reflective layer can comprise many different materials and structures including but not limited to reflective metals or multiple layer reflective structures such as distributed Bragg reflectors. Reflective layers can also be included around the LEDs in those embodiments not having a optical cavity.

The carrier layer 64 can be made of many different materials having a thermal conductivity of 0.5 W/m-k or more, such as quartz, silicon carbide (SiC) (thermal conductivity ~120 W/m-k), glass (thermal conductivity of 1.0-1.4 W/m-k) or sapphire (thermal conductivity of ~40 W/m-k). In other embodiments, the carrier layer 64 can have thermal conductivity greater than 1.0 W/m-k, while in other embodiments it can have thermal conductivity of greater than 5.0 W/m-k. In still other embodiments it can have a thermal conductivity of greater that 10 W/m-k. In some embodiments the carrier layer can have thermal conductivity ranging from 1.4 to 10 W/m-k. The phosphor carrier can also have different thicknesses depending on the material being used, with a suitable range of thicknesses being 0.1 mm to 10 mm or more. It is understood that other thicknesses can also be used depending on the characteristics of the material for the carrier layer. The material should be thick enough to provide sufficient lateral heat spreading for the particular operating conditions. Generally, the higher the thermal conductivity of the material, the thinner the material can be while still providing the necessary thermal dissipation. Different factors can impact which carrier layer material is used including but not limited to cost and transparency to the light source light. Some materials may also be more suitable for larger diameters, such as glass or quartz. These can provide reduced manufacturing costs by formation of the phosphor layer on the larger diameter carrier layers and then singulation into the smaller carrier layers.

Many different phosphors can be used in the phosphor layer 66 with the present invention being particularly adapted to lamps emitting white light. As described above, in some embodiments the light source 58 can be LED based and can emit light in the blue wavelength spectrum. The phosphor layer can absorb some of the blue light and re-emit yellow. This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for creating white light when used with a blue emitting LED based emitter include but not limited to:
$Tb_{3-x}RE_xO_{12}$:Ce(TAG); RE=Y, Gd, La, Lu; or
$Sr_{2-x-y}Ba_xCa_ySiO_4$:Eu.

The phosphor layer can also be arranged with more than one phosphor either mixed in with the phosphor layer 66 or as a second phosphor layer on the carrier layer 64. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:
$Sr_xCa_{1-x}$S:Eu, Y; Y=halide;
$CaSiAlN_3$:Eu; or
$Sr_{2-y}Ca_ySiO_4$:Eu Other phosphors can be used to create color emission by converting substantially all light to a particular color. For example, the following phosphors can be used to generate green light:
$SrGa_2S_4$:Eu;
$Sr_{2-y}Ba_ySiO_4$:Eu; or
$SrSi_2O_2N_2$:Eu.

The following lists some additional suitable phosphors used as conversion particles phosphor layer 66, although others can be used. Each exhibits excitation in the blue and/or UV emission spectrum, provides a desirable peak emission, has efficient light conversion, and has acceptable Stokes shift:
YELLOW/GREEN
(Sr,Ca,Ba) $(Al,Ga)_2S_4$:$Eu^{2+}$
$Ba_2$ (Mg,Zn) $Si_2O_7$:$Eu^{2+}$
$Gd_{0.46}Sr_{0.31}Al_{1.23}O_xF_{1.38}$:$Eu^{2+}{}_{0.06}$
$(Ba_{1-x-y}Sr_xCa_y)$ $SiO_4$:Eu
$Ba_2SiO_4$:$Eu^{2+}$
$Lu_3Al_5O_{12}$ doped with $Ce^{3+}$
(Ca,Sr,Ba) $Si_2O_2N_2$ doped with $Eu^{2+}$
CaSc2O4:$Ce^{3+}$
(Sr,Ba) 2SiO4:$Eu^{2+}$
RED
$Lu_2O_3$:$Eu^{3+}$
$(Sr_{2-x}La_x)$ $(Ce_{1-x}Eu_x)O_4$
$Sr_2Ce_{1-x}Eu_xO_4$
$Sr_{2-x}Eu_xCeO_4$
$SrTiO_3$:$Pr^{3+}$,$Ga^{3+}$
$CaAlSiN_3$:$Eu^{2+}$
$Sr_2Si_5N_8$:$Eu^{2+}$ Different sized phosphor particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be provided in the phosphor layer 66 in a binder, and the phosphor can also have different concentrations or loading of phosphor materials in the binder. A typical concentration being in a range of 30-70% by weight. In one embodiment, the phosphor concentration is approximately 65% by weight, and is preferably uniformly dispersed throughout the remote phosphor. The phosphor layer 66 can also have different regions with different conversion materials and different concentrations of conversion material.

Different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

Phosphor layer 66 can be applied using different processes including but not limited to spin coating, sputtering, printing, powder coating, electrophoretic deposition (EPD), electrostatic deposition, among others. As mentioned above, the phosphor layer 66 can be applied along with a binder material, but it is understood that a binder is not required. In still other embodiments, the phosphor layer 66 can be separately fabricated and then mounted to the carrier layer 64.

In one embodiment, a phosphor-binder mixture can be sprayed or dispersed over the carrier layer 64 with the binder then being cured to form the phosphor layer 66. In some of these embodiments the phosphor-binder mixture can be sprayed, poured or dispersed onto or over the a heated carrier layer 64 so that when the phosphor binder mixture contacts the carrier layer 64, heat from the carrier layer spreads into and cures the binder. These processes can also include a solvent in the phosphor-binder mixture that can liquefy and lower the viscosity of the mixture making it more compatible with spraying. Many different solvents can be used including but not limited to toluene, benzene, zylene, or OS-20 commercially available from Dow Corning®, and different concentration of the solvent can be used. When the solvent-phosphor-binder mixture is sprayed or dispersed on the heated carrier layer 64 the heat from the carrier layer 64 evaporates the solvent, with the temperature of the carrier layer impacting how quickly the solvent is evaporated. The heat from the carrier layer 64 can also cure the binder in the mixture leaving a fixed phosphor layer on the carrier layer. The carrier layer 64 can be heated to many different temperatures depending on the materials being used and the desired solvent evaporation and binder curing speed. A suitable range of temperature is 90 to 150° C., but it is understood that other temperatures can also be used. Various deposition methods and systems are described in U.S. Patent Application Publication No. 2010/0155763, to Donofrio et al, entitled "Systems and Methods for Application of Optical Materials to Optical Elements," and also assigned to Cree, Inc. This application was filed concurrently with this application and is incorporated herein by reference.

The phosphor layer 66 can have many different thicknesses depending at least partially on the concentration of phosphor material and the desired amount of light to be converted by the phosphor layer 66. Phosphor layers according to the present invention can be applied with concentration levels (phosphor loading) above 30%. Other embodiments can have concentration levels above 50%, while in still others the concentration level can be above 60%. In some embodiments the phosphor layer can have thicknesses in the range of 10-100 microns, while in other embodiments it can have thicknesses in the range of 40-50 microns.

The methods described above can be used to apply multiple layers of the same of different phosphor materials and different phosphor materials can be applied in different areas of the carrier layer using known masking processes. The methods described above provide some thickness control for the phosphor layer 66, but for even greater thickness control the phosphor layer can be ground using known methods to reduce the thickness of the phosphor layer 66 or to even out the thickness over the entire layer. This grinding feature provides the added advantage of being able to produce lamps emitting within a single bin on the CIE chromaticity graph. Binning is generally known in the art and is intended to ensure that the LEDs or lamps provided to the end customer emit light within an acceptable color range. The LEDs or lamps can be tested and sorted by color or brightness into different bins, generally referred to in the art as binning. Each bin typically contains LEDs or lamps from one color and brightness group and is typically identified by a bin code. White emitting LEDs or lamps can be sorted by chromaticity (color) and luminous flux (brightness). The thickness control of the phosphor layer provides greater control in producing lamps that emit light within a target bin by controlling the amount of light source light converted by the phosphor layer. Multiple phosphor carriers 62 with the same thickness of phosphor layer 66 can be provided. By using a light source 58 with substantially the same emission characteristics, lamps can be manufactured having nearly the same emission characteristics that in some instances can fall within a single bin. In some embodiments, the lamp emissions fall within a standard deviation from a point on a CIE diagram, and in some embodiments the standard deviation comprises less than a 10-step McAdams ellipse. In some embodiments the emission of the lamps falls within a 4-step McAdams ellipse centered at CIExy(0.313, 0.323).

The phosphor carrier 62 can be mounted and bonded over the opening in the cavity 54 using different known methods or materials such as thermally conductive bonding materials or a thermal grease. Conventional thermally conductive grease can contain ceramic materials such as beryllium oxide and aluminum nitride or metal particles such colloidal silver. In other embodiments the phosphor carrier can be mounted over the opening using thermal conductive devices such as clamping mechanisms, screws, or thermal adhesive hold phosphor carrier 62 tightly to the heat sink structure to maximize thermal conductivity. In one embodiment a thermal grease layer is used having a thickness of approximately 100 µm and thermal conductivity of k=0.2 W/m-k. This arrangement provides an efficient thermally conductive path for dissipating heat from the phosphor layer 66. As mentioned above, different lamp embodiments can be provided without cavity and the phosphor carrier can be mounted in many different ways beyond over an opening to the cavity.

During operation of the lamp 50, phosphor conversion heating is concentrated in the phosphor layer 66, such as in the center of the phosphor layer 66 where the majority of LED light strikes and passes through the phosphor carrier 62. The thermally conductive properties of the carrier layer 64 spreads this heat laterally toward the edges of the phosphor carrier 62 as shown by first heat flow 70. There the heat passes through the thermal grease layer and into the heat sink structure 52 as shown by second heat flow 72 where it can efficiently dissipate into the ambient.

As discussed above, in the lamp 50 the platform 56 and the heat sink structure 52 can be thermally connected or coupled. This coupled arrangement results in the phosphor carrier 62 and that light source 58 at least partially sharing a thermally conductive path for dissipating heat. Heat passing through the platform 56 from the light source 58 as shown by third heat flow 74 can also spread to the heat sink structure 52. Heat from the phosphor carrier 62 flowing into the heat sink structure 52 can also flow into the platform 56. As further described below, in other embodiments, the phosphor carrier 62 and the light source 58 can have separate thermally conductive paths for dissipating heat, with these separate paths being referred to as "decoupled" as described in U.S. Provisional Patent Application Ser. No. 61/339,516, to Tong et al. incorporated by reference above.

It is understood that the phosphor carriers can be arranged in many different ways beyond the embodiment shown in FIG. 4. The phosphor layer can be on any surface of the carrier layer or can be mixed in with the carrier layer. The phosphor carriers can also comprise scattering layers that can be included on or mixed in with the phosphor layer or carrier layer. It is also understood that the phosphor and scattering layers can cover less than a surface of the carrier layer and in some embodiments the conversion layer and scattering layer can have different concentrations in different areas. It is also understood that the phosphor carrier can have different roughened or shaped surfaces to enhance emission through the phosphor carrier.

As mentioned above, the diffuser is arranged to disperse light from the phosphor carrier and LED into the desired lamp emission pattern, and can have many different shapes and sizes. In some embodiments, the diffuser also can be arranged over the phosphor carrier to mask the phosphor carrier when the lamp is not emitting. The diffuser can have materials to give a substantially white appearance to give the bulb a white appearance when the lamp is not emitting.

Many different diffusers with different shapes and attributes can be used with lamp 50 as well as the lamps described below, such as those described in U.S. Provisional Patent Application No. 61/339,515, titled "LED Lamp With Remote Phosphor and Diffuser Configuration", file on Mar. 3, 2010, which is incorporated herein by reference. Diffuser can also take different shapes, including but not limited to generally asymmetric "squat" as in U.S. patent application Ser. No. 12/901,405, titled "Non-uniform Diffuser to Scatter Light Into Uniform Emission Pattern," filed on Oct. 8, 2010, incorporated herein by reference The lamps according to the present invention can comprise many different features beyond those described above. Referring again to FIG. 4, in those lamp embodiments having a cavity 54 can be filled with a transparent heat conductive material to further enhance heat dissipation for the lamp. The cavity conductive material could provide a secondary path for dissipating heat from the light source 58. Heat from the light source would still conduct through the platform 56, but could also pass through the cavity material to the heat sink structure 52. This would allow for lower operating temperature for the light source 58, but presents the danger of elevated operating temperature for the phosphor carrier 62. This arrangement can be used in many different embodiments, but is particularly applicable to lamps having higher light source operating temperatures compared to that of the phosphor carrier. This arrangement allows for the heat to be more efficiently spread from the light source in applications where additional heating of the phosphor carrier layer can be tolerated.

As discussed above, different lamp embodiments according to the present invention can be arranged with many different types of light sources. In one embodiment eight LEDs can be used that are connected in series with two wires to a circuit board. The wires can then be connected to the power supply unit described above. In other embodiments, more or less than eight LEDs can be used and as mentioned above, commercially available LEDs from Cree, Inc. can used including eight XLamp® XP-E LEDs or four XLamp® XP-G LEDs. Different single string LED circuits are described in U.S. patent application Ser. No. 12/566,195, to van de Ven et al., entitled "Color Control of Single String Light Emitting Devices Having Single String Color Control, and U.S. patent application Ser. No. 12/704,730 to van de Ven et al., entitled "Solid State Lighting Apparatus with Compensation Bypass Circuits and Methods of Operation Thereof", both of with are incorporated herein by reference.

Figure 5:
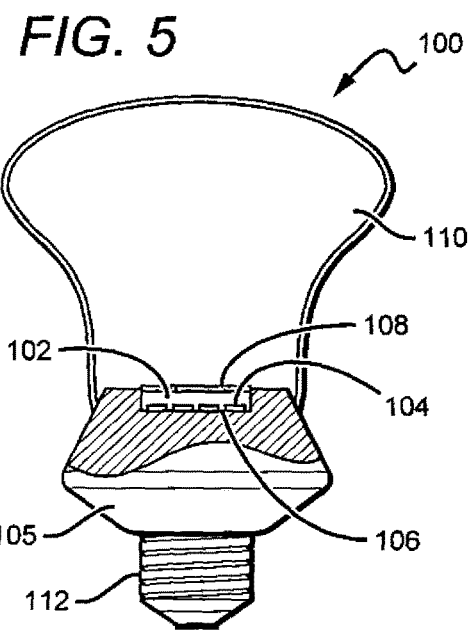
FIG. 5 is a sectional view of one embodiment of a lamp according to the present invention.

FIG. 5 shows still another embodiment of lamp 100 according to the present invention that comprises an optical cavity 102 within a heat sink structure 105. Like the embodiments above, the lamp 100 can also be provided without a lamp cavity, with the LEDs mounted on a surface of the heat sink or on a three dimensional or pedestal structures having different shapes. A planar LED based light source 104 is mounted to the platform 106, and a phosphor carrier 108 is mounted to the top opening of the cavity 102, with the phosphor carrier 108 having any of the features of those described above. In the embodiment shown, the phosphor carrier 108 can be in a flat disk shape and comprises a thermally conductive transparent material and a phosphor layer. It can be mounted to the cavity with a thermally conductive material or device as described above. The cavity 102 can have reflective surfaces to enhance the emission efficiency as described above.

Light from the light source 104 passes through the phosphor carrier 108 where a portion of it is converted to a different wavelength of light by the phosphor in the phosphor carrier 108. In one embodiment the light source 104 can comprise blue emitting LEDs and the phosphor carrier 108 can comprise a yellow phosphor as described above that absorbs a portion of the blue light and re-emits yellow light. The lamp 100 emits a white light combination of LED light and yellow phosphor light. Like above, the light source 104 can also comprise many different LEDs emitting different colors of light and the phosphor carrier can comprise other phosphors to generate light with the desired color temperature and rendering.

The lamp 100 also comprises a shaped diffuser dome 110 mounted over the cavity 102 that includes diffusing or scattering particles such as those listed above. The scattering particles can be provided in a curable binder that is formed in the general shape of dome. In the embodiment shown, the dome 110 is mounted to the heat sink structure 105 and has an enlarged portion at the end opposite the heat sink structure 105. Different binder materials can be used as discussed above such as silicones, epoxies, glass, inorganic glass, dielectrics, BCB, polymides, polymers and hybrids thereof. In some embodiments white scattering particles can be used with the dome having a white color that hides the color of the phosphor in the phosphor carrier 108 in the optical cavity. This gives the overall lamp 100 a white appearance that is generally more visually acceptable or appealing to consumers than the color of the phosphor. In one embodiment the diffuser can include white titanium dioxide particles that can give the diffuser dome 110 its overall white appearance.

The diffuser dome 110 can provide the added advantage of distributing the light emitting from the optical cavity in a more uniform pattern. As discussed above, light from the light source in the optical cavity can be emitted in a generally Lambertian pattern and the shape of the dome 110 along with the scattering properties of the scattering particles causes light to emit from the dome in a more omnidirectional emission pattern. An engineered dome can have scattering particles in different concentrations in different regions or can be shaped to a specific emission pattern. In some embodiments, including those described below, the dome can be engineered so that the emission pattern from the lamp complies with the Department of Energy (DOE) Energy Star defined omnidirectional distribution criteria. One requirement of this standard met by the lamps herein is that the emission uniformity must be within 20% of mean value from 0 to 135° viewing and; >5% of total flux from the lamp must be emitted in the 135-180° emission zone, with the measurements taken at 0, 45, 90° azimuthal angles. As mentioned above, the different lamp embodiments described herein can also comprise A-type retrofit LED bulbs that meet the DOE Energy Star® standards. The present invention provides lamps that are efficient, reliable and cost effective. In some embodiments, the entire lamp can comprise five components that can be quickly and easily assembled.

Like the embodiments above, the lamp 100 can comprise a mounting mechanism 112 of the type to fit in conventional electrical receptacles. In the embodiment shown, the lamp 100 includes a screw-threaded portion 112 for mounting to a standard Edison socket. Like the embodiments above, the lamp 100 can include standard plug and the electrical receptacle can be a standard outlet, or can comprise a GU24 base unit, or it can be a clip and the electrical receptacle can be a receptacle which receives and retains the clip (e.g., as used in many fluorescent lights).

As mentioned above, the space between some of the features of the lamp 100 can be considered mixing chambers, with the space between the light source 106 and the phosphor carrier 108 comprising a first light mixing chamber. The space between the phosphor carrier 108 and the diffuser 110 can comprise a second light mixing chamber, with the mixing chamber promoting uniform color and intensity emission for the lamp. The same can apply to the embodiments below having different shaped phosphor carriers and diffusers. In other embodiments, additional diffusers and/or phosphor carriers can be included forming additional mixing chambers, and the diffusers and/or phosphor carriers can be arranged in different orders.

Figure 6:
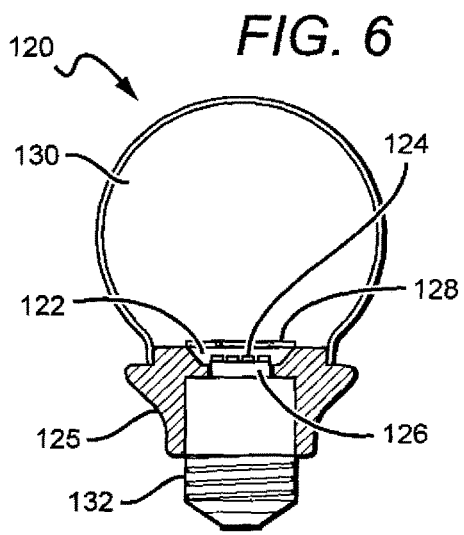
FIG. 6 is a sectional view of one embodiment of a lamp according to the present invention.

Different lamp embodiments according to the present invention can have many different shapes and sizes. FIG. 6 shows another embodiment of a lamp 120 according to the present invention that is similar to the lamp 100 and similarly comprises an optical cavity 122 in a heat sink structure 125 with a light source 124 mounted to the platform 126 in the optical cavity 122. Like above, the heat sink structure need not have an optical cavity, and the light sources can be provided on other structures beyond a heat sink structure. These can include planar surfaces or pedestals having the light source. A phosphor carrier 128 is mounted over the cavity opening with a thermal connection. The lamp 120 also comprises a diffuser dome 130 mounted to the heat sink structure 125, over the optical cavity. The diffuser dome can be made of the same materials as diffuser dome 110 described above, but in this embodiment the dome 130 is oval or egg shaped to provide a different lamp emission pattern while still masking the color from the phosphor in the phosphor carrier 128. It is also noted that the heat sink structure 125 and the platform 126 are thermally de-coupled. That is, there is a space between the platform 126 and the heat sink structure such that they do not share a thermal path for dissipating heat. As mentioned above, this can provide improved heat dissipation from the phosphor carrier compared to lamps not having de-coupled heat paths. The lamp 120 also comprises a screw-threaded portion 132 for mounting to an Edison socket.

In the embodiments above, the phosphor carriers are two dimensional (or flat/planar) with the LEDs in the light source being co-planer. It is understood, however, that in other lamp embodiments the phosphor carriers can take many different shapes including different three-dimensional shapes. The term three-dimensional is meant to mean any shape other than planar as shown in the above embodiments. FIGS. 7 through 10 show different embodiments of three-dimensional phosphor carriers according to the present invention, but it is understood that they can also take many other shapes. As discussed above, when the phosphor absorbs and re-emits light, it is re-emitted in an isotropic fashion, such that the 3-dimensional phosphor carrier serves to convert and also disperse light from the light source. Like the diffusers described above, the different shapes of the 3-dimensional carrier layers can emit light in emission patterns having different characteristics that depends partially on the emission pattern of the light source. The diffuser can then be matched with the emission of the phosphor carrier to provide the desired lamp emission pattern.

Figure 7:
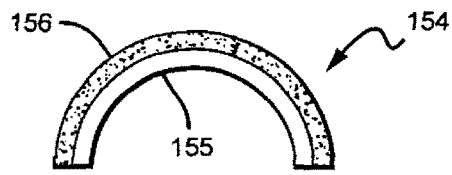
FIG. 7-10 are sectional views of different embodiments of a phosphor carrier according to the present invention.

FIG. 7 shows a hemispheric shaped phosphor carrier 154 comprising a hemispheric carrier 155 and phosphor layer 156. The hemispheric carrier 155 can be made of the same materials as the carrier layers described above, and the phosphor layer can be made of the same materials as the phosphor layer described above, and scattering particles can be included in the carrier and phosphor layer as described above.

In this embodiment the phosphor layer 156 is shown on the outside surface of the carrier 155 although it is understood that the phosphor layer can be on the carrier's inside layer, mixed in with the carrier, or any combination of the three. In some embodiments, having the phosphor layer on the outside surface may minimize emission losses. When emitter light is absorbed by the phosphor layer 156 it is emitted omnidirectionally and some of the light can emit backwards and be absorbed by the lamp elements such as the LEDs. The phosphor layer 156 can also have an index of refraction that is different from the hemispheric carrier 355 such that light emitting forward from the phosphor layer can be reflected back from the inside surface of the carrier 355. This light can also be lost due to absorption by the lamp elements. With the phosphor layer 156 on the outside surface of the carrier 155, light emitted forward does not need to pass through the carrier 155 and will not be lost to reflection. Light that is emitted back will encounter the top of the carrier where at least some of it will reflect back. This arrangement results in a reduction of light from the phosphor layer 156 that emits back into the carrier where it can be absorbed.

The phosphor layer 156 can be deposited using many of the same methods described above. In some instances the three-dimensional shape of the carrier 155 may require additional steps or other processes to provide the necessary coverage. In the embodiments where a solvent-phosphor-binder mixture is sprayed and the carrier can be heated as described above and multiple spray nozzles may be needed to provide the desired coverage over the carrier, such as approximate uniform coverage. In other embodiments, fewer spray nozzles can be used while spinning the carrier to provide the desired coverage. Like above, the heat from the carrier 155 can evaporate the solvent and helps cure the binder.

In still other embodiments, the phosphor layer can be formed through an emersion process whereby the phosphor layer can be formed on the inside or outside surface of the carrier 155, but is particularly applicable to forming on the inside surface. The carrier 155 can be at least partially filled with, or otherwise brought into contact with, a phosphor mixture that adheres to the surface of the carrier. The mixture can then be drained from the carrier leaving behind a layer of the phosphor mixture on the surface, which can then be cured. In one embodiment, the mixture can comprise polyethylen oxide (PEO) and a phosphor. The carrier can be filled and then drained, leaving behind a layer of the PEO-phosphor mixture, which can then be heat cured. The PEO evaporates or is driven off by the heat leaving behind a phosphor layer. In some embodiments, a binder can be applied to further fix the phosphor layer, while in other embodiments the phosphor can remain without a binder.

Like the processes used to coat the planar carrier layer, these processes can be utilized in three-dimensional carriers to apply multiple phosphor layers that can have the same or different phosphor materials. The phosphor layers can also be applied both on the inside and outside of the carrier, and can have different types having different thickness in different regions of the carrier. In still other embodiments different processes can be used such as coating the carrier with a sheet of phosphor material that can be thermally formed to the carrier.

In lamps utilizing the carrier 155, an emitter can be arranged at the base of the carrier so that light from the emitters emits up and passes through the carrier 155. In some embodiments the emitters can emit light in a generally Lambertian pattern, and the carrier can help disperse the light in a more uniform pattern.

Figure 8:
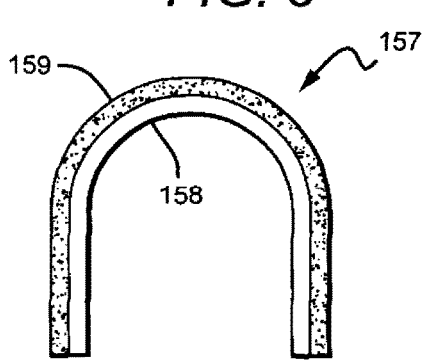
Figure 9:
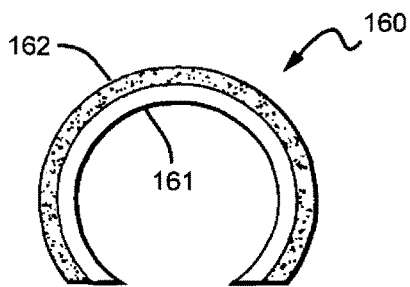

FIG. 8 shows another embodiment of a three dimensional phosphor carrier 157 according to the present invention comprising a bullet-shaped carrier 158 and a phosphor layer 159 on the outside surface of the carrier. The carrier 158 and phosphor layer 159 can be formed of the same materials using the same methods as described above. The different shaped phosphor carrier can be used with a different emitter to provide the overall desired lamp emission pattern. FIG. 9 shows still another embodiment of a three dimensional phosphor carrier 160 according to the present invention comprising a globe-shaped carrier 161 and a phosphor layer 162 on the outside surface of the carrier. The carrier 161 and phosphor layer 162 can be formed of the same materials using the same methods as described above.

Figure 10:
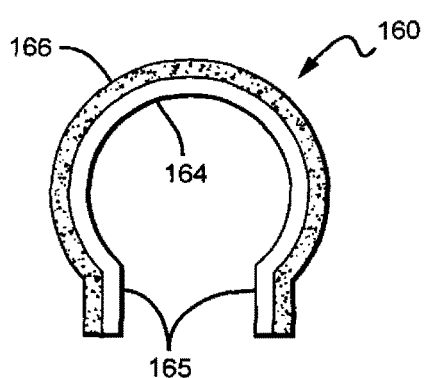

FIG. 10 shows still another embodiment phosphor carrier 163 according to the present invention having a generally globe shaped carrier 164 with a narrow neck portion 165. Like the embodiments above, the phosphor carrier 163 includes a phosphor layer 166 on the outside surface of the carrier 164 made of the same materials and formed using the same methods as those described above. In some embodiments, phosphor carriers having a shape similar to the carrier 164 can be more efficient in converting emitter light and re-emitting light from a Lambertian pattern from the light source, to a more uniform emission pattern.

Figure 11:
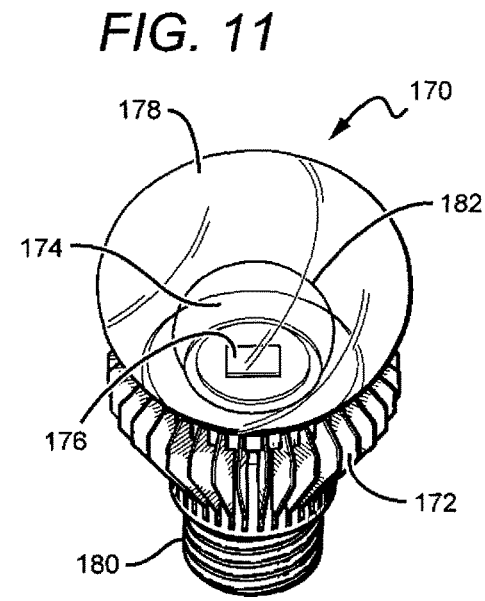
FIG. 11 is a perspective view of one embodiment of a lamp according to the present invention.
Figure 12:
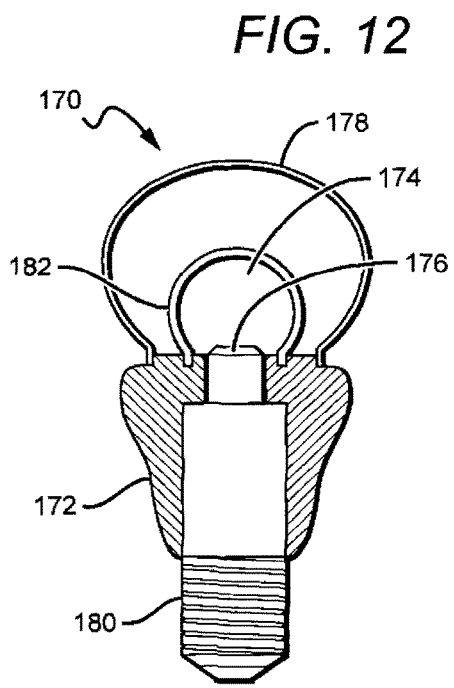
FIG. 12 is a sectional view of the lamp shown in FIG. 11.
Figure 13:
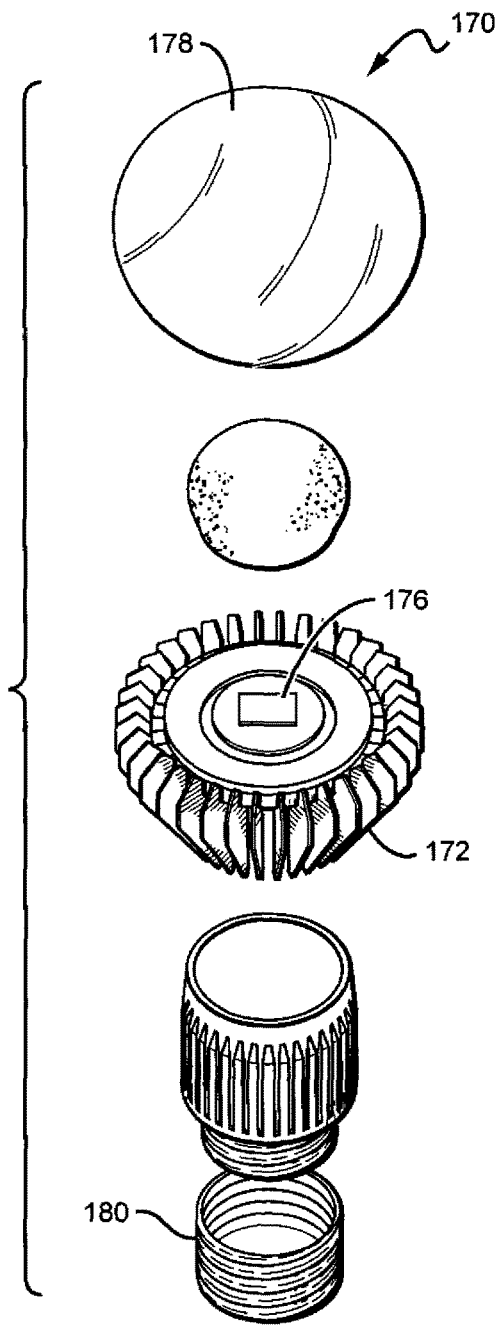
FIG. 13 is an exploded view of the lamp shown in FIG. 11.

FIGS. 11 through 13 show another embodiment of a lamp 170 according to the present invention having a heat sink structure 172, optical cavity 174, light source 176, diffuser dome 178 and a screw-threaded portion 180. This embodiment also comprises a three-dimensional phosphor carrier 182 that includes a thermally conductive transparent material and one phosphor layer. It is also mounted to the heat sink structure 172 with a thermal connection. In this embodiment, however, the phosphor carrier 182 is hemispheric shaped and the emitters are arranged so that light from the light source passes through the phosphor carrier 182 where at least some of it is converted.

The three dimensional shape of the phosphor carrier 182 provides natural separation between it and the light source 176. Accordingly, the light source 176 is not mounted in a recess in the heat sink that forms the optical cavity. Instead, the light source 176 is mounted on the top surface of the heat sink structure 172, with the optical cavity 174 formed by the space between the phosphor carrier 182 and the top of the heat sink structure 172. This arrangement can allow for a less Lambertian emission from the optical cavity 174 because there are no optical cavity side surfaces to block and redirect sideways emission.

In embodiments of the lamp 170 utilizing blue emitting LEDs for the light source 176 and yellow and red phosphor combination in the phosphor carrier. This can cause the phosphor carrier 182 to appear yellow or orange, and the diffuser dome 178 masks this color while dispersing the lamp light into the desired emission pattern. In lamp 170, the conductive paths for the platform and heat sink structure are coupled, but it is understood that in other embodiments they can be de-coupled.

Figure 14:
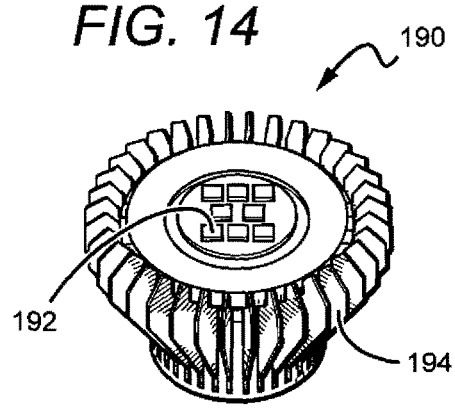
FIG. 14 is a perspective view of one embodiment of a lamp according to the present invention.
Figure 15:
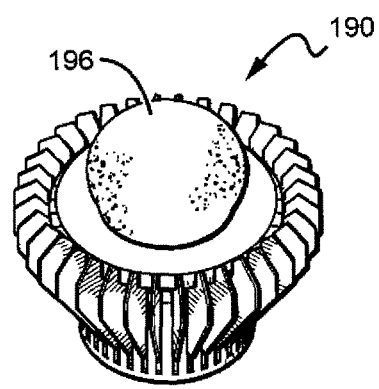
FIG. 15 is a perspective view of the lamp in FIG. 14 with a phosphor carrier.

FIG. 14 shows one embodiment of a lamp 190 according to the present invention comprising a eight LED light source 192 mounted on a heat sink 194 as described above. The emitters can comprise many different types of LEDs that can be coupled together in many different ways and in the embodiment shown are serially connected. In other embodiments, the LEDs can be interconnected in different series and parallel interconnect combinations. It is noted that in this embodiment the emitters are not mounted in a optical cavity, but are instead mounted on top planar surface of the heat sink 194. FIG. 15 shows the lamp 190 shown in FIG. 14 with a dome-shaped phosphor carrier 196 mounted over the light source 192 shown in FIG. 14. The lamp 190 shown in FIG. 15 can be combined with the diffuser 198 as described above to form a lamp with dispersed light emission.

As discussed above, lamps according to the present invention can also comprise thermal dissipation features to allow the LEDs to operate at lower temperatures and optical elements to change the emission pattern of the LEDs chips into a desired emission pattern. In some embodiments that can comprise an substantially omni-directional emission pattern.

Figure 16:
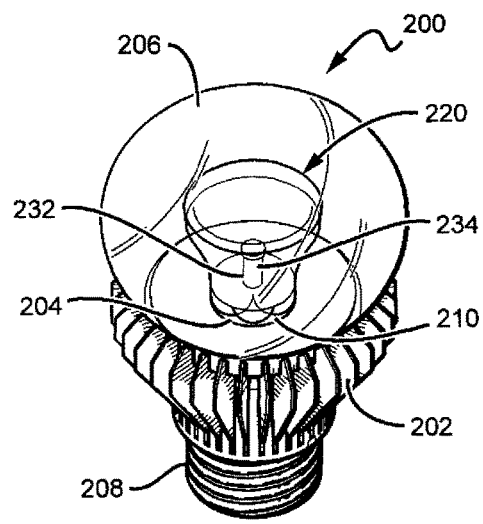
FIG. 16 is a perspective view of another embodiment of a lamp according to the present invention.
Figure 18:
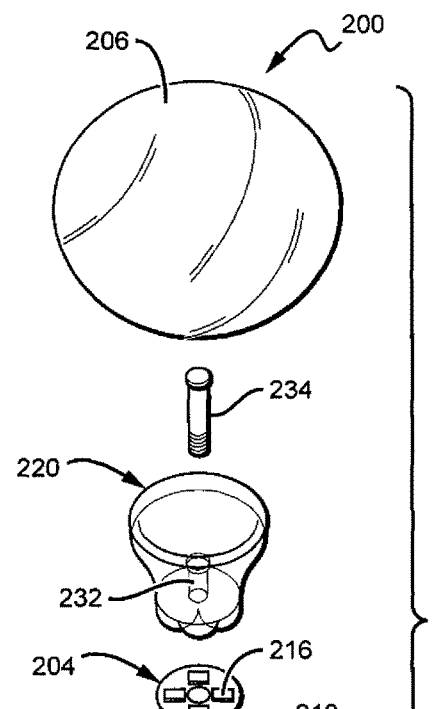
FIG. 18 is an exploded view of the lamp shown in FIG. 16.
Figure 18:
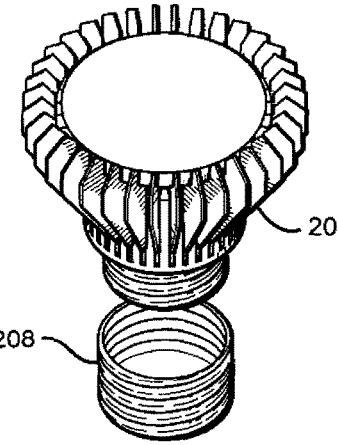
Figure 17:
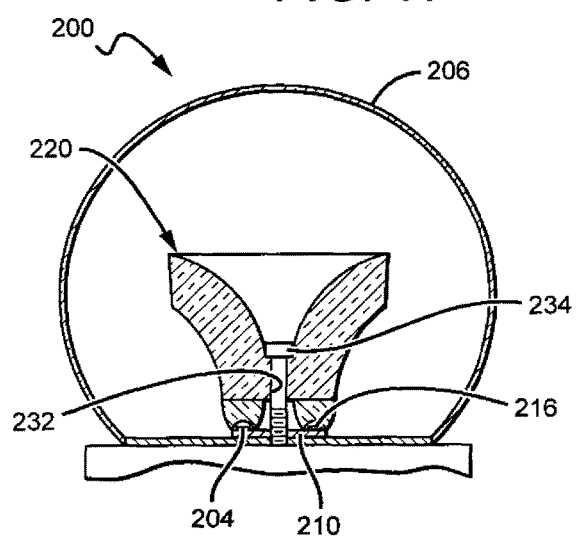
FIG. 17 is a sectional view of the top portion of the lamp shown in FIG. 16.

FIGS. 16 through 18 show another embodiment of a lamp 200 according to the present invention having a heat sink structure 202, light source 204, phosphor carrier 206 and a screw-threaded portion 208, as described above. The phosphor carrier is three-dimensional and can include a thermally conductive transparent material and a layer of phosphor material as described above. It is also mounted to the heat sink structure 202, suitably with a thermal connection. The light source 204 comprises a one or a plurality of LED chips mounted on the top surface of the heat sink structure 202. It is understood that the lamps according to the present invention can also comprise other heat dissipation elements beyond a heat sink, such as heat pipes.

The lamp 200 also comprises a lateral spreading heat dissipation structure 210 below the LEDs to provide for improved thermal management of the heat generated by the LEDs. In conventional lamp arrangements the LEDs can be mounted on dielectric substrates (such as $Al_2O_3$), and heat from the LEDs can encounter the thermally resistant dielectric materials prior to having the opportunity to spread laterally. The different dissipation structures according to the present invention are arranged to laterally spread heat from the LEDs prior to the heat encountering the thermally resistant dielectric layer.

Figure 19:
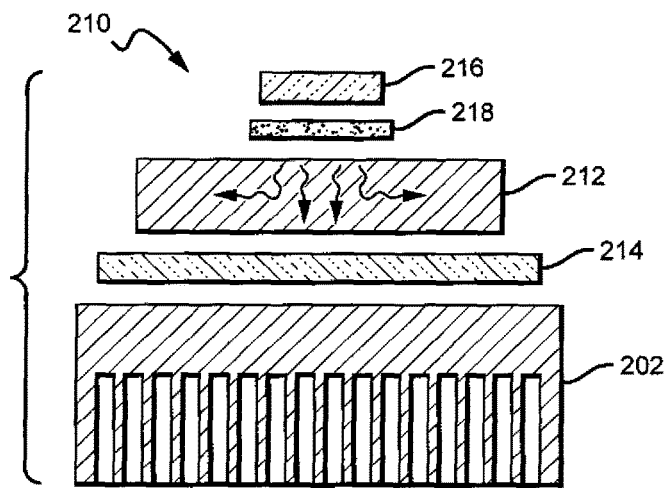
FIG. 19 is a schematic of one embodiment of a dielectric substrate and heat sink according to the present invention.

FIG. 19 shows one embodiment of a heat dissipation structure 210 according to the present invention, comprising a relatively thick thermally conductive heat spreading substrate 212 and a dielectric layer 214 that are in thermal contact with the heat sink 202. One or more LED chips 216 can be mounted directly to the heat spreading substrate 212 with a thermally conductive material such as a solder 218. This results in a structure where there is no dielectric between the LED chip 216 and the heat spreading substrate 212. By spreading the heat of the LEDs 216 prior to the heat encountering the dielectric layer 214, the thermally resistant impact of the dielectric layer 214 is reduced, and heat more efficiently spreads from the LEDs 216. This arrangement provides enhanced thermal spreading in close proximity to the LED chip(s) and minimizes the total number of thermally impeding (e.g. dielectric) layers between the LED chip and the heat sink 202.

The heat spreading substrate 212 can comprise many different materials that are thermally conductive. In some embodiments the heat spreading substrate can comprise a metal such as copper, while in other embodiments the substrate 212 can comprise copper plated with gold. In still other embodiments the substrate 212 can comprise other thermally conductive materials, such as other metals. The substrate can be many different thicknesses with suitable thicknesses providing the thermal conductivity to efficiently and laterally spread heat from the LED(s) 216. In some embodiments, the thickness of the substrate 212 can be in the range of approximately 0.05 mm to 10 mm, while in other embodiments the thickness can be in the range of 0.5 mm to 2 mm.

As mentioned above, substrate 212 should be in close thermal contact with the LED(s) 216. In some embodiments, the LED(s) can be soldered to the heat spreading substrate 212 using conventional lead-free solders such as SnAgCu or AuSn. The dielectric layers according to the present invention should have suitable thermal conductivity and electrical breakdown resistance properties to allow heat to pass between the heat spreading substrate 212 and the heat heat sink 202 to allow efficient dissipation of heat into the surrounding ambient while still providing the desired electrical insulation. In some embodiments, the system comprises a single dielectric layer.

Figure 20:
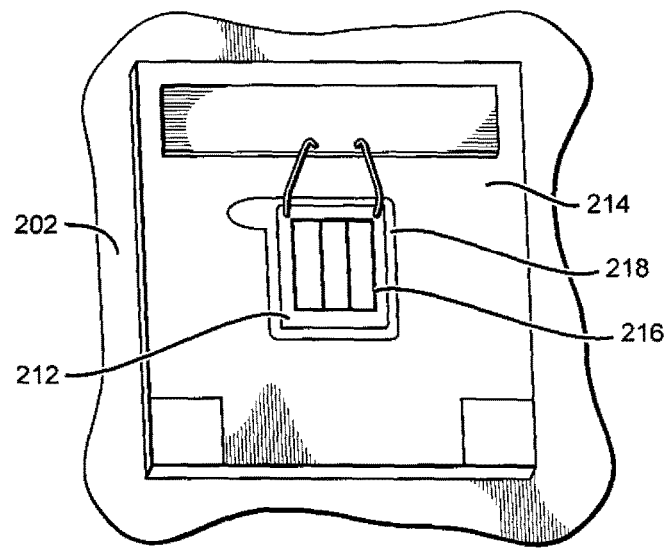
FIG. 20 is a perspective view of one embodiment of an LED chip on a metallic substrate according to the present invention.
Figure 21:
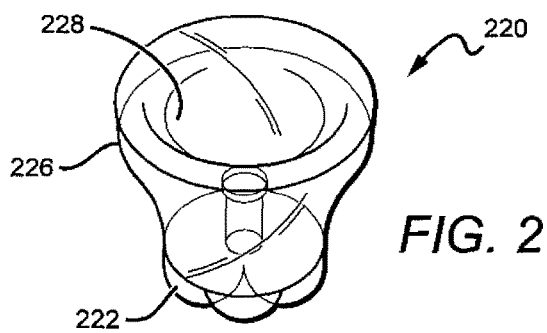
FIG. 21 is a perspective view of one embodiment of an optical element according to the present invention.
Figure 22:
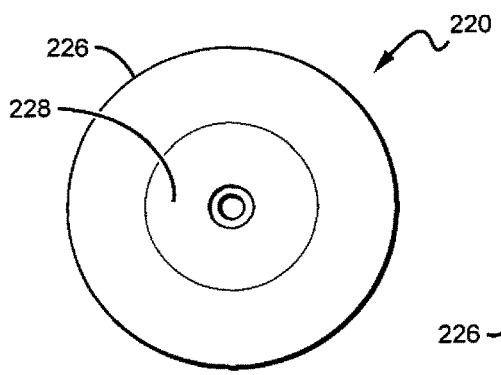
FIG. 22 is top view of the optical element shown in FIG. 21.
Figure 23:
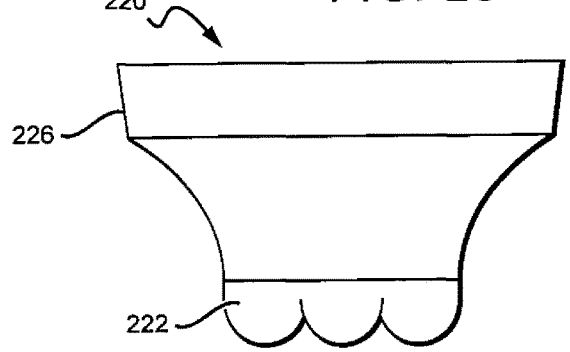
FIG. 23 is a side view of the optical element shown in FIG. 21.
Figure 24:
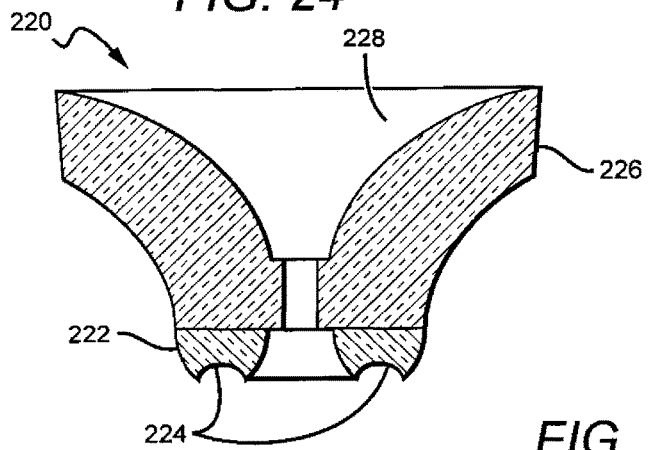
FIG. 24 is a sectional view of the optical element shown in FIG. 21.

In some embodiments, the dielectric layer 214 can be bonded directly to the heat spreading substrate 212, while in other embodiments it can be bonded directly to the heat sink. FIG. 20 shows one embodiment of an LED (or LED chip) 216 bonded directly to the heat spreading substrate 212. Bonding the dielectric layer to the heat sink element allows for the additional advantage of extending the dielectric layer 214 beyond and surrounding the boundaries of the heat spreading substrate 212. This in turn minimizing electric breakdown pathways along the edge of the heat spreading substrate 212 at the boundary. This arrangement can comprise a simple and cost effective structure that provides an LED 216, solder 218, heat spreading substrate 212, dielectric layer 214 and heat sink 202 on one another in a "sandwich" design. The allows for significant lateral spreading of the heat generated by the LED 216 to the heat spreading substrate 212 prior to dielectric layers and thereby significantly decreasing the thermal resistance between the LED 216 and heat sink 202 or the ambient. This enables reduced LED operating temperatures at a given operating current, resulting in improved efficiency (efficacy) and reliability, while simplifying manufacturing assembly and reducing costs. This provides an improvement over current technology that typically requires multiple dielectric layers to provide electrical isolation between LED chips and heat sink.

Referring again to FIGS. 16 through 18, the lamp 200 can also comprise a optical element 220 that is arranged to guide light from a single or multiple LED chips into a desired output beam profile. The optical element can be made of material and can have a shape that allows for efficient change the emission profile with minimal light loss. In a preferred embodiment, the optical element can comprise many different clear optical materials such as acrylic, polycarbonate, silicone, glass, cyclo olefin polymers such as Zeonex® commerally available from Zeon Coporation, and commercially available Apel®, and Topas®. The optical element 220 can be arranged to at least partially change the emission pattern from the LED(s), to the desired lamp emission pattern. The optical elements can partially or fully change to the desired emission pattern. In those embodiments where the optical element 220 partially changes the emission pattern, the lamp can utilize a phosphor carrier and/or diffuser for the remainder of the pattern change.

It is understood that the optical element can have many different shapes and sizes depending on the LED light source emission pattern and the desired lamp emission pattern, and in many embodiments comprises a three-dimensional (i.e. non-planar) shape. Referring now to FIGS. 21 through 24, one embodiment of an optical element 220 comprises a curved conical or mushroom shape. The lower portion 222 can have a curved section 224 that is sized to fit over the lens of an LED chip with little or no air gap (best shown in FIG. 24). This helps direct and collimate the LED light so that is passes into the optical element 220. Due to the directional nature of light emission from conventional LEDs (e.g. Lambertian) it can be challenging to achieve omni-directional lamp emission from co-planar LED sources. Co-planar sources, however, can provide improved thermal management and simplified manufacturing compared to non-coplanar arrangements. The optical element 220 can be made of the materials listed above can utilize total internal reflection (TIR) to guide light from coplanar LEDs into a more omni-directional pattern. The desired output light beam pattern can be achieved while preserving the simplicity and performance of co-planar LED arrangements. The optical element can also provide for the uniform distribution of light into a remote phosphor or scattering layer enabling further improvements in efficiency as well as a high degree of color uniformity in the emitted light beam.

Figure 25:
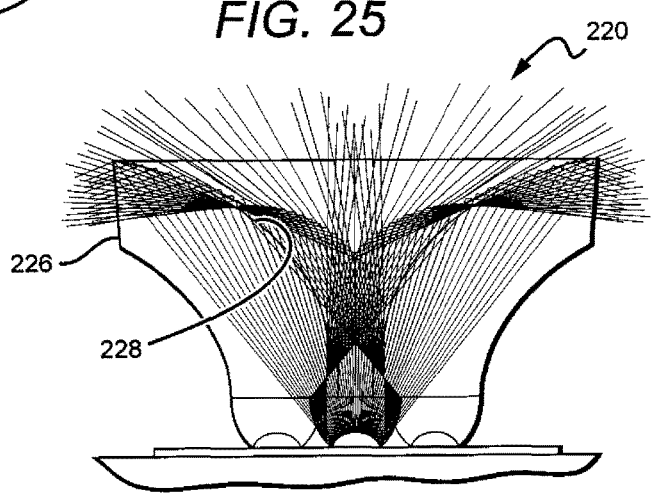
FIG. 25 is a side view of the an optical element according to the present invention showing light ray traces from the light sources.
Figure 26:
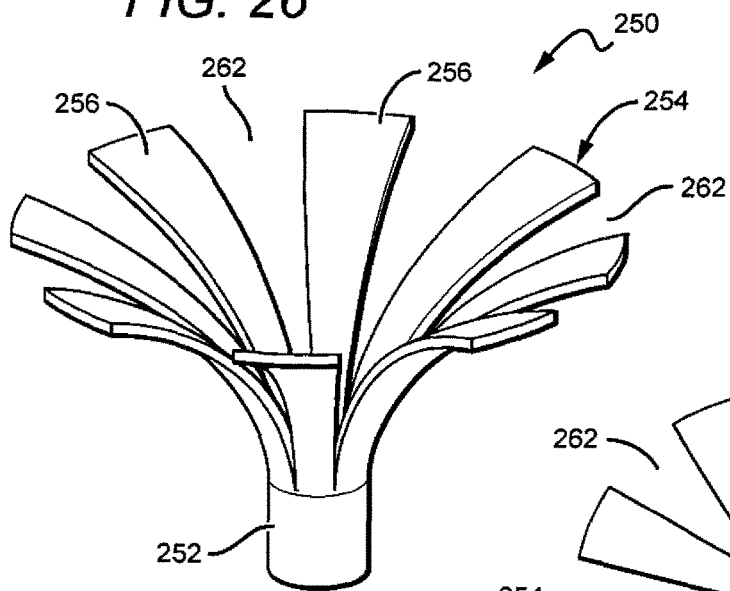
FIG. 26 is a perspective view of another embodiment of an optical element according to the present invention.
Figure 27:
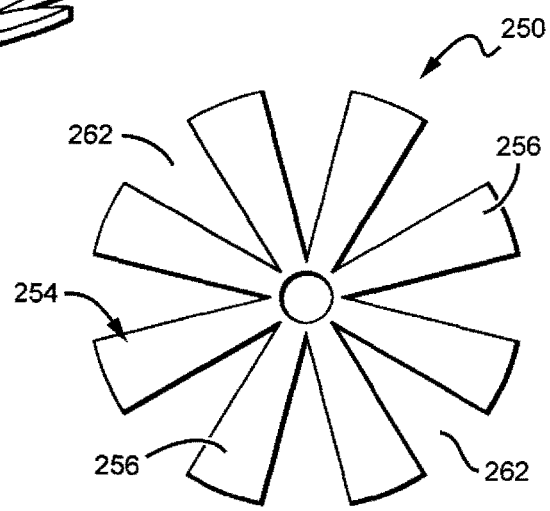
FIG. 27 is a top view of the optical element shown in FIG. 26.

FIG. 25 shows the optical element 220 with light ray traces showing how the directional emission of an LED can be changed to more omni-directional. Light from the LED chips is coupled into optical element as described above, with a portion of the LED light being guided down the optical element by TIR in combination with refraction. This guided light can emit from the optical element 220 from side emission surface 226 to provide a portion of the broad beam pattern that can be exceed approximately 70 degrees or more. In other embodiments that emission pattern can exceed approximately 80 degrees or more, and in still other embodiments it can exceed 90 degrees or more. The side surface 226 can be at many different angles depending on the desired emission angle of light from the side surface 226. In the embodiments shown, the side surface 226 is angled slightly downward, but it is understood that the surface can be at other angles or vertical.

A portion of the LED light can also escape from the optical element's upper curved surface 228 (best shown in FIGS. 24 and 25) out its top surface toward the top of the lamp to provide additional emission beyond that from the emission surface 226. The amount of light that escapes can depend on different factors such as the curvature of the upper curved surface 228 and the material comprising the optical element 220. This escaping light contributes to the overall lamp emission pattern, particularly in those embodiments emitting more omni-directional emission patterns. In the embodiment shown the optical element is directing light from four LEDs, but it is understood that other embodiments can utilize either a single LED or multiple LEDs with an optical element to disperse light from the LEDs into the desired beam pattern.

Referring again to FIGS. 16 through 18 and as mentioned above, the lamp 200 can also comprise remote phosphor carrier 206 that can have the feature and materials similar to those described above. In other embodiments, the lamp 200 can also comprise a diffuser, also as described above. By separating the phosphor material from the LEDs by arranging the phosphor in a remote phosphor carrier, improvements in light conversion efficiency and color uniformity can be obtained. For example, this arrangement allows for the use of a more disperse or dilute phosphor concentration, thereby reducing local heating of the phosphor particles, which reduces that impact that heat has on efficiency of the phosphor particles. The phosphor carrier 206 can comprise a thermally conductive material as described above to allow efficient flow of heat generated by the light conversion process from the phosphor material to the surrounding environment or to the heat sink 202.

By shaping the phosphor carrier 206 into a three-dimensional dome-shape, and illuminating the phosphor carrier with, for example, blue light from the LEDs 216 via the optical element, it is possible to ensure nearly identical path lengths through the phosphor carrier 206 for each light ray emited from the LED. The probability of light conversion by the phosphor material in phosphor carrier 206 is generally proportional to the path length of light through the phosphor material (assuming substantially uniform phosphor concentrations), uniform color emission can be achieved with the mixture of direct and downconverted LED light, over a broad range of beam angles.

Another advantage of the lamp arrangements according to the present invention having an optical element 220 and remotely located phosphor carrier 206 (or scattering layer) is that the arrangement serves to reduce the amount of light absorbed in the during operation of the lamp 200, thereby increasing the over efficacy of the lamp 200. In a typical LED lamp that incorporates one or more phosphors in combination with an LED, the phosphor is located in close proximity to the LED chip. Thus, a significant portion of the light that is emitted by or scattered by the phosphor is directed back towards the LED chip and/or other absorbing surfaces surrounding the chip. This can lead to light absorption and light loss at these surfaces. The lamps embodiments described herein can reduce this light loss in that light emitted or scattered by the remote phosphor carrier 206 (or diffuser) has reduced chance of being directed into the LED chip surface or adjacent absorbing regions due to the optical design of the optical element. It some embodiments, a low-loss scattering or reflective material can be placed on the interior surfaces of the lamp 200 (such as the surface of the dielectric layer or heat sink) to further limit the absorption of light emitted or scattered by the remote phosphor carrier.

The lamp 200 shown in FIG. 16 through 18 comprises a simple and inexpensive arrangement for achieving physical and thermal contact between the heat spreading substrate 212 and the heat sink 202. The optical element 220 can comprise a central opening or hole 232 through which a fastener or clamping connector (such as a screw or clip) 234 can pass and be mounted to the heat sink 202. This connector 234 can serve to "clamp" or press the optical element 220, heat spreading substrate 212, dielectric layer 214, and heat sink 202 together. This serves to attach these portions of the lamp 200 together, as well as pressing the heat spreading substrate 212 to the heat sink 202 with a dielectric layer 214 between the two. This can eliminate the need for an adhesive or solder joint layer between these elements that can add expense, manufacturing complexity, and can inhibit heat flow between the LED chip 216 and the ambient.

Another advantage with this arrangement is that it allows for convenient "re-working" of the lamp during manufacturing by allowing for the easy removal of defective lamp components without the danger of damage to surrounding components. This feature can also provide for lifetime cost reduction in that failing components (such as the LED package assembly) could be removed and replaced without replacing the entire lamp assemble (heat sink, bulb enclosure, etc. which typically have very long lifetimes). Further, this component-based assembly could help reduce manufacturing costs since different color point lamps could be achieved simply by replacing the bulb enclosure/phosphor carrier, allowing for uniform manufacture of the remainder of the assembly across color points. As an added benefit, multiple bulb enclosures with different phosphor combinations could be provided to the customer to allow flexible in-service changing of the color/hue of the lamp by the customer.

It is understood that many different optical elements can be arranged in many different ways according to the present invention. They can have many different shapes, made of many different materials, and can have many different properties. FIGS. 26 through 29 show another embodiment of an optical element 250 according to the present invention that can utilize specular and/or scattering reflections to redirect the light from the LED sources into larger beam angles or preferred directions. Optical element 250 is generally flower shaped and is particularly applicable to redirecting light from co-planar solid state light sources such as co-planar LEDs. The optical element comprises a narrow bottom or stem section 252 that can be mounted to the co-planar light source. In the embodiment shown, the bottom section comprises a hollow tube section, but it is understood that it can comprise many different shapes and may not be hollow.

The optical element also comprises an upper reflective section 254 that spreads from bottom section 252 moving up the optical element. The upper section 254 comprises a series of reflective blades or petals 256 that are over the LEDs 258 (best shown in FIG. 28) so that light from the LEDs 258 strikes the bottom surface of the blades 256 and is reflected. In the embodiment shown, the width of the blades 256 increase moving up the optical element 250 to reflect more LED light at the top, but it is understood that the in other embodiments the blades can have the same or decreasing width moving up the optical element. It is also understood that different ones of the blades can have different widths or can have widths increase or decrease in different ways moving up the optical element.

Figure 28:
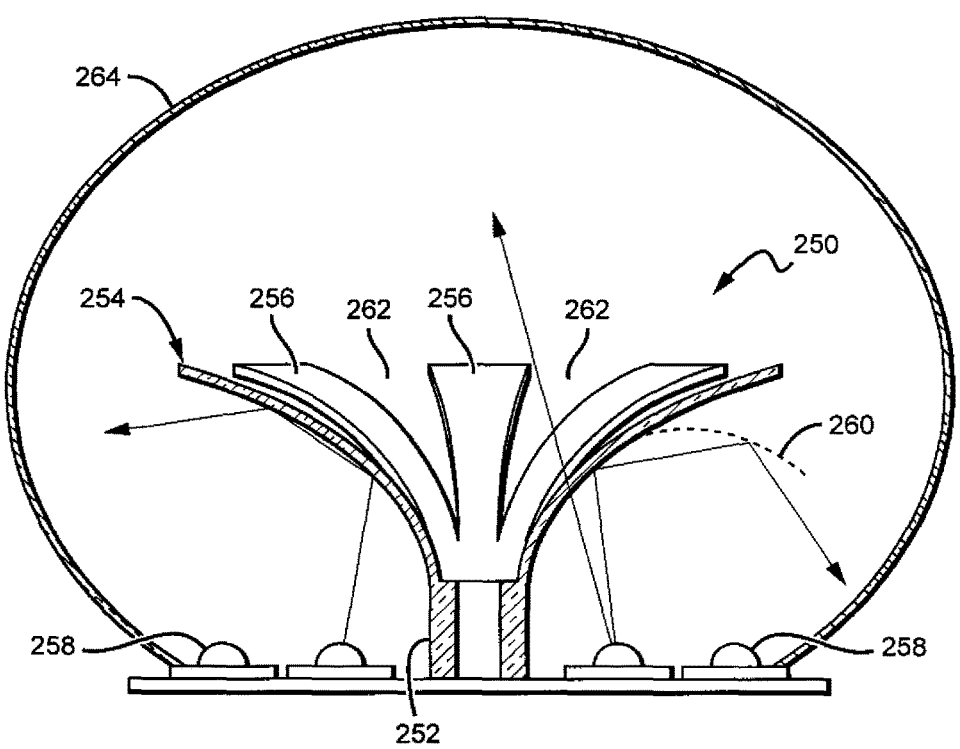
FIG. 28 is a side view of another embodiment of a lamp according to the present invention.

The reflection of LED light from the blades 256 helps disperse the light from the LEDs 258 to the desired emission pattern. The blades 256 can be angled or curved from the bottom section, and depending on the desired emission pattern, the blades can have different curves or angles. There can be different curves or angles in different portions of the blades 256 and different ones of the blades can have different angles and curves. Referring now to FIG. 28, a increased curvature blade 260 is shown, with the increased curvature causing reflection at higher beam angles. The light reflected from the high curvature blade 260 emits in more of a downward direction. This can result in an overall lamp emission with a portion of emission at higher beam angles that is particularly useful in embodiments where omni-directional emission is desired (e.g. Energy Star® emission).

There can also be a space 262 between the blades 256 that allows light from the LEDs 258 to pass. The light passing the blades 256 can provide forward emitting light from the LEDs, which can also be useful in embodiments where omni-directional emission is desired. Different embodiments can have different numbers and sizes of blades 256 and spaces 262 depending on the desired emission pattern. In some embodiments, the space 262 between the blades 256 can include a conversion or disperser material that can convert or disperse the LED light as it passes through the space.

Optical element 250 can provide certain advantages in that the dispersing element can be light-weight and fabricated inexpensively from tube or horn-shaped foils or reflective polymer elements. In other embodiments the optical element 250 can simply comprise reflective paper or plastic. Further, by relying on specular and/or scattering reflection, the size of the element may be reduced relative to elements utilizing TIR since TIR surfaces may only reflect the incident light up to a maximum angle determined primarily by the difference in index of refraction between the element and the surrounding ambient.

It is understood that the specular and/or scattering optical elements can have many different shapes and sizes and can be arranged in many different ways. In some embodiments, the spaces between the blades can comprise different shapes such as holes or slots, and the spaces can be in many different locations. It is also understood that the optical element can be mounted in lamps in many different ways beyond mounting to the light source. In some embodiments it can be mounted to a phosphor carrier or diffuser. Other optical element embodiments may include a combinations of TIR, specular reflection and scattering to achieve the desired beam dispersion.

As with the optical element 220 shown in FIGS. 21 to 25 and described above, the optical element 250 can be used in lamp also comprising a phosphor carrier 264 (best shown in FIG. 28). The phosphor carrier 264 can have the same features as those described above and can be made of the same materials. The phosphor carrier 264 can have a dome-shape over the optical element 250 and LEDs 258 and comprise a conversion material, such as a phosphor, that converts at least a portion of the LED light passing through it. The phosphor carrier 264 can also disperse the light thereby smoothing out emission intensity variations to the blocked or reflected light from the optical element 250. Other embodiments can also comprise a diffuser (not shown) over the phosphor carrier to further disperse the light into a desired emission pattern. The diffuser can have the same features and can be made of the same materials as the diffusers described above.

The LED arrays according to the present invention can be coupled together in many different serial and parallel combinations. In one embodiment, the red and blue LEDs can be interconnected in different groups that can comprise their own various series and parallel combinations. By having separate strings, the current applied to each can be controlled to produce the desired lamp color temperature, such as 3000K. FIGS. 28 and 29, show the performance characteristics for an LED array with 3 red and 5 blue (450 nm) LEDs.

Some LED lamps according to the present invention can have a correlated color temperature (CCT) from about 1200K to 3500K, with a color rendering index of 80 or more. Other lamp embodiments can emit light with a luminous intensity distribution that varies by not more than 10% from 0 to 150 degrees from the top of the lamp. In other embodiments, lamps can emit light with a luminous intensity distribution that varies by not more than 20% from 0 to 135 degrees. In some embodiments, at least 5% of the total flux from the lamps is in the 135-180 degree zone. Other embodiments can emit light having a luminous intensity distribution that varies by not more than 30% from 0 to 120 degrees. In some embodiments, the LED lamp has a color spatial uniformity of such that chromaticity with change in viewing angle varies by no more than 0.004 from a weighted average point. Other lamps can conform to the operational requirements for luminous efficacy, color spatial uniformity, light distribution, color rendering index, dimensions and base type for a 60-watt incandescent replacement bulb.

The lamps according to the present invention can emit light with a high color rendering index (CRI), such as or higher in some embodiments. In some other embodiments, the lamps can emit light with CRI of 90 or higher. The lamps can also produce light having a correlated color temperature (CCT) from 2500K to 3500K. In other embodiments, the light can have a CCT from 2700K to 3300K. In still other embodiments, the light can have a CCT from about 2725K to about 3045K. In some embodiments, the light can have a CCT of about 2700K or about 3000K. In still other embodiments, where the light is dimmable, the CCT may be reduced with dimming. In such a case, the CCT may be reduced to as low as 1500K or even 1200K. In some embodiments, the CCT can be increased with dimming. Depending on the embodiment, other output spectral characteristics can be changed based on dimming.

Although the present invention has been described in detail with reference to certain preferred configurations thereof, other versions are possible. Therefore, the spirit and scope of the invention should not be limited to the versions described above.

We claim:
1. A solid state lamp, comprising:
at least one light emitting diode (LED) on a mount surface;
an optical element comprising an inner diameter, an outer diameter, and a curved portion shaped to fit over and at least partially surround said at least one LED, such that light from said at least one LED interacts with said optical element, said optical element shaped to define a hollow central opening, said optical element changing the emission pattern of said LED to a broader emission pattern;
said outer diameter varying with distance away from said mount surface in a perpendicular direction to define a curved conical side emission surface, said inner diameter defining said hollow central opening in said optical element;
a fastener passing through said central opening and fastening said optical element to said mount surface; and
a phosphor carrier over said optical element, said phosphor carrier converting at least some of said LED light to a different wavelength.

2. The lamp of claim 1, wherein said optical element comprises a substantially transparent material, light from said at least one LED guided by said optical element into a broader emission pattern.

3. The lamp of claim 2, wherein light from said at least one LED is guided in said optical element by total internal reflection.

4. The lamp of claim 2, wherein light from said at least one LED is guided in said optical element by refraction.

5. The lamp of claim 2, wherein a portion of light from said at least one LED is guided by said optical element to emit at an angle of 70 degrees or more to said at least one LED.

6. The lamp of claim 2, wherein a portion of light from said at least one LED is guided by said optical element to emit at an angle of 80 degrees or more to said at least one LED.

7. The lamp of claim 2, wherein a portion of light from said at least one LED is guided by said optical element to emit at an angle of 90 degrees or more to said at least one LED.

8. The lamp of claim 2, wherein a portion of light from said at least one LED passes out of said optical element.

9. The lamp of claim 2, wherein said optical element has a three-dimensional shape.

10. The lamp of claim 1, further comprising a heat spreading substrate to spread heat from said LED prior to encountering heat resistant materials.

* * * * *